US011448822B2

(12) United States Patent
Holt et al.

(10) Patent No.: US 11,448,822 B2
(45) Date of Patent: Sep. 20, 2022

(54) SILICON-ON-INSULATOR CHIP STRUCTURE WITH SUBSTRATE-EMBEDDED OPTICAL WAVEGUIDE AND METHOD

(71) Applicant: GLOBALFOUNDRIES U.S. Inc., Malta, NY (US)

(72) Inventors: Judson R. Holt, Ballston Lake, NY (US); Yusheng Bian, Ballston Lake, NY (US); Dali Shao, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 23 days.

(21) Appl. No.: 17/131,997

(22) Filed: Dec. 23, 2020

(65) Prior Publication Data
US 2022/0196909 A1    Jun. 23, 2022

(51) Int. Cl.
*G02B 6/12*   (2006.01)
*G02B 6/122*  (2006.01)
(Continued)

(52) U.S. Cl.
CPC ..... *G02B 6/12004* (2013.01); *G02B 6/12002* (2013.01); *G02B 6/12* (2013.01);
(Continued)

(58) Field of Classification Search
CPC .. G02B 6/12; G02B 6/12002; G02B 6/12004; G02B 6/12019; G02B 6/122; G02B 6/30; H01L 29/0649
See application file for complete search history.

(56) References Cited

U.S. PATENT DOCUMENTS

| 9,450,381 | B1* | 9/2016 | Cai | ............ H01L 29/6625 |
| 11,262,500 | B2* | 3/2022 | Iida | ............ G02F 1/025 |

(Continued)

OTHER PUBLICATIONS

Bian et al., "Towards Low-Loss Monolithic Silicon and Nitride Photonic Building Blocks in State-of-the-Art 300mm CMOS Foundry", Frontiers in Optics/Laser Science, OSA Technical Digest (Optical Society of America), 2020, pp. 1-3.

(Continued)

*Primary Examiner* — Ryan A Lepisto
(74) *Attorney, Agent, or Firm* — Francois Pagette; Hoffman Warnick LLC

(57) ABSTRACT

Disclosed is a silicon-on-insulator (SOI) chip structure with a substrate-embedded optical waveguide. Also disclosed is a method for forming the SOI chip structure. In the method, an optical waveguide is formed within a trench in a bulk substrate prior to a wafer bonding process that results in the SOI structure. Subsequently, front-end-of-the-line (FEOL) processing can be performed to form additional optical devices and/or electronic devices in and/or above the silicon layer. By embedding an optical waveguide within the substrate prior to wafer bonding as opposed to forming it during FEOL processing, strict limitations on the dimensions of the core layer of the optical waveguide are avoided. The core layer of the substrate-embedded optical waveguide can be relatively large such that the cut-off wavelength can be relatively long. Thus, such a substrate-embedded optical waveguide brings different functionality to the SOI chip structure as compared to FEOL optical waveguides.

20 Claims, 15 Drawing Sheets

(51) Int. Cl.
　　　*H01L 29/06*　　　(2006.01)
　　　*G02B 6/30*　　　(2006.01)
(52) U.S. Cl.
　　　CPC .......... *G02B 6/122* (2013.01); *G02B 6/12019* (2013.01); *G02B 6/30* (2013.01); *H01L 29/0649* (2013.01)

(56) References Cited

U.S. PATENT DOCUMENTS

2019/0377133 A1　　12/2019　Meade
2020/0081184 A1　　3/2020　Orcutt et al.
2021/0271023 A1*　9/2021　Chang .................... G02B 6/124

OTHER PUBLICATIONS

Feng et al., "High Speed Ge Photodetector Monolithically Integrated with Large Cross-Section Silicon-on-Insulator Waveguide", Applied Physics Letters, vol. 95, 261105, 2009, pp. 1-4.

Kohlstedt et al., "Two-Dimensional X-Ray Waveguides: Fabrication by Wafer-Bonding Process and Characterization", Applied Physics A, Materials Science & Processing, vol. 91, 2008, pp. 7-12.

Lousteau et al., "The Single-Mode Condition for Silicon-on-Insulator Optical Rib Waveguides With Large Cross Section", IEEE, Journal of Lightwave Technology, vol. 22, No. 8, 2004, pp. 1923-1929.

Giewont et al., "300mm Monolithic Silicon Photonics Foundry Technology", IEEE Journal of Selected Topics in Quantum Electronics, vol. 25, No. 5, 2019, pp. 1-12.

Rakowski et al., "45nm CMOS—Silicon Photonics Monolithic Technology (45CLO) for Next-Generation, Low Power and High Speed Optical Interconnects", Optical Fiber Communication Conference, OSA Publishing, 2020, pp. 1-3.

Soref et al., "Large Single-Mode Rib Waveguides in GeSi—Si and Si-on-SiO2", IEEE Journal of Quantum Electronics, vol. 27, No. 8, 1991, pp. 1971-1974.

Soref et al., "Vertically Integrated Silicon-on-Insulator Waveguides", IEEE Photonics Technology Letters, vol. 3, No. 1, 1991, pp. 22-24.

Splett et al., "Low Loss Single-Mode Optical Waveguides with Large Cross-Section in Standard Epitaxial Silicon", IEEE Photonics Technology Letters, vol. 6, No. 3, 1994, pp. 425-427.

Wilmart et al., "A Versatile Silicon-Silicon Nitride Photonics Platform for Enhanced Functionalities and Applications", Applied Sciences, vol. 9, 255, 2019, pp. 1-16.

Gao et al., "High-Performance Chemical Vapor Deposited Graphene-on-Silicon Nitride Waveguide Photodetectors", Optics Letters, vol. 43, No. 6, 2018, pp. 1399-1402.

Chatterjee et al., "High-Speed Waveguide Integrated Silicon Photodetector on SiN—SOI Platform for Short Reach Datacom", Optics Letters, vol. 44, Issue 7, 2019, pp. 1-5.

Yanikgonul et al., "Simulation of Silicon Waveguide Single-Photon Avalanche Detectors for Integrated Quantum Photonics", IEEE Journal of Selected Topics in Quantum Electronics, 2019, pp. 1-9.

* cited by examiner

SILICON-ON-INSULATOR CHIP STRUCTURE WITH SUBSTRATE-EMBEDDED OPTICAL WAVEGUIDE AND METHOD

BACKGROUND

Field of the Invention

The present invention relates to integrated circuits (ICs) and, more particularly, to embodiments of a silicon-on-insulator (SOI) chip structure with at least one optical waveguide and to embodiments of a method of forming the SOI chip structure.

Description of Related Art

Integrated circuit (IC) chips can incorporate a combination of both optical devices and electronic devices. Such chips can be either bulk semiconductor (e.g., bulk silicon) chip structures or semiconductor-on-insulator (e.g., silicon-on-insulator (SOI)) chip structures. Advantages associated with SOI chip structures include, but are not limited to, improved isolation, improved radiation tolerance, and reduced parasitic capacitance. One disadvantage associated with SOI chip structures relates to the integration of both optical devices and electronic devices into the same SOI chip structure. Specifically, in SOI chip structures with both optical devices and electronic devices, the maximum dimensions of the core layers of optical waveguides can be limited by other critical dimensions (CDs). Unfortunately, since the dimensions of the core layer of an optical waveguide determine the properties of that optical waveguide, including the cut-off wavelength (i.e., the maximum wavelength of any optical signals that can be propagated by the waveguide), any limitations on the dimensions of the core layer also impact functionality.

SUMMARY

Disclosed are embodiments of a silicon-on-insulator (SOI) chip structure. The structure can include a substrate. A trench can extend into the substrate from the top surface of the substrate toward the bottom surface. The structure can further include a substrate-embedded optical waveguide (referred to herein as a first waveguide) within the trench. The first waveguide can include a cladding layer that lines the trench and a core layer on the cladding layer such that bottom and side surfaces of the core layer are wrapped by the cladding layer. The structure can further include an insulator layer on the top surface of the substrate and extending laterally over the first waveguide. The structure can further include a silicon layer on the insulator layer and one or more front-end-of-the-line (FEOL) devices with components in and/or above the silicon layer (i.e., above the insulator layer). The FEOL device(s) can include, for example, additional optical device(s) and/or electronic device(s).

Also disclosed herein are method embodiments for forming the above-described SOI chip structure. Generally, the method can include providing a substrate. A trench can be formed in the substrate such that it extends from the top surface toward the bottom surface. A substrate-embedded optical waveguide (referred to herein as a first waveguide) can be formed in the trench such that it includes a cladding layer and a core layer. The cladding layer can line the bottom and sidewalls of the trench. The core layer can be within the trench on the cladding layer such that its bottom and side surfaces are wrapped by the cladding layer. An insulator layer can be formed on the top surface of the substrate such that it covers the first waveguide. After the insulator layer is formed, a silicon layer can be formed on the insulator layer. Following formation of the silicon layer on the insulator layer, FEOL processing can be performed in order to form one or more FEOL devices (e.g., additional optical device(s) and/or electronic device(s)) with components in and/or above the silicon layer (i.e., above the insulator layer).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, advantages associated with silicon-on-insulator (SOI) chip structures include, but are not limited to, improved isolation, improved radiation tolerance, and reduced parasitic capacitance. One disadvantage associated with SOI chip structures relates to the integration of both optical devices and electronic devices into the same SOI chip structure. Specifically, in SOI chip structures with both optical devices and electronic devices, the maximum dimensions of the core layers of optical waveguides can be limited by other critical dimensions (CDs).

Figure 1:
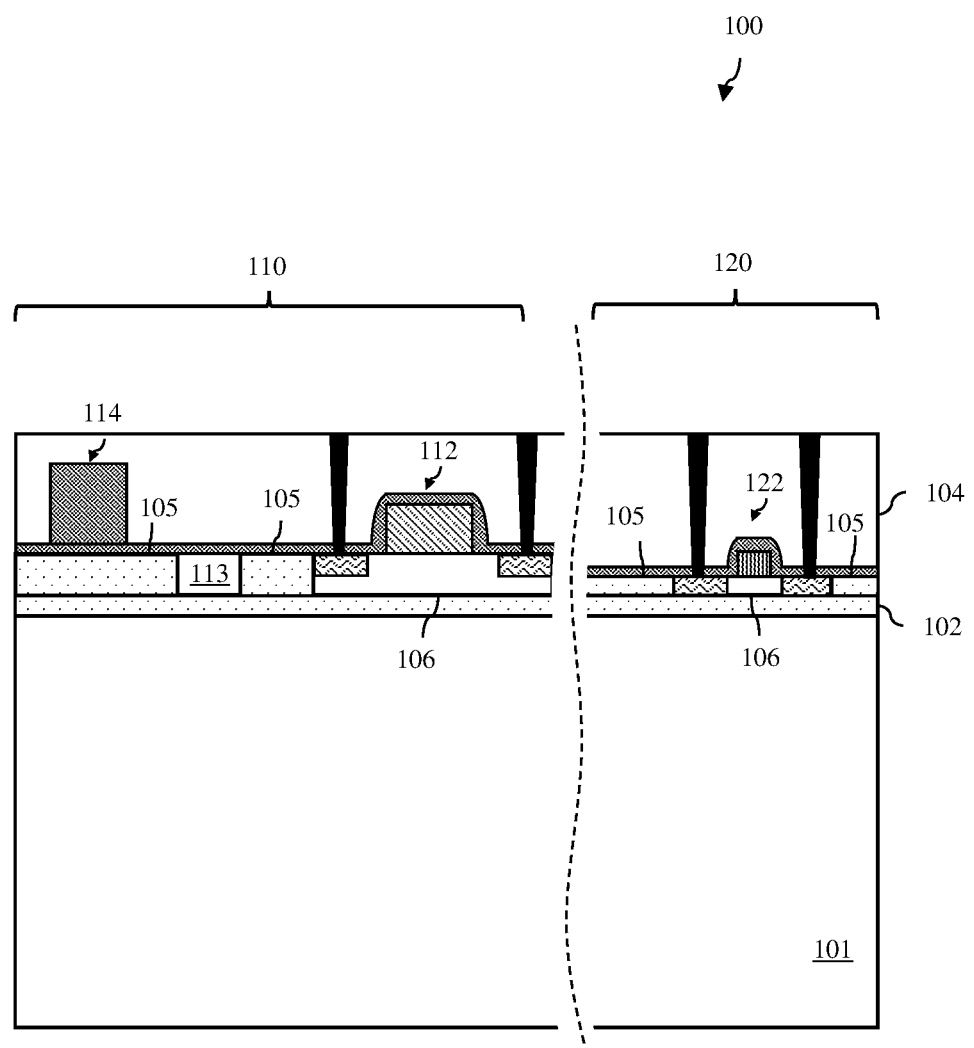
FIG. 1 is a cross-section diagram illustrating a chip structure with optical and electronic device areas.

For example, FIG. 1 is a cross-section diagram illustrating an exemplary SOI chip structure 100. This SOI chip structure 100 includes: a substrate 101 (e.g., a silicon (Si) substrate); an insulator layer 102 (e.g., a buried oxide (BOX) layer) on the substrate 101; and a Si layer 106 on the insulator layer 102. The SOI chip structure 100 includes multiple devices areas including an optical device area 110 and an electronic device area 120.

Optionally, the Si layer 106 is relatively thick in the optical device area 110 and relatively thin in the electronic device area 120. The optical device area 110 can include one or more optical devices above the insulator layer 102. Such optical device(s) can include, for example, one or more Si waveguides 113 (where each Si waveguide has a Si core layer patterned into the Si layer 106), one or more silicon nitride (SiN) waveguide 114 (where each SiN waveguide has a SiN core layer on a shallow trench isolation (STI) region 105 above the level of the Si waveguides(s) 113), one or more photodetectors 112 (where each photodetector 112 has components both in and above the Si layer 106), one or more optical modulators, etc. The electronic device area 120 can include one or more electronic devices. Such electronic devices(s) can include complementary metal oxide semiconductor (CMOS) devices (e.g., one or more field effect transistors (FETs) 122) and various other electronic devices (e.g., active or passive semiconductor devices, etc.). The optical and electronic devices can be covered by an interlayer dielectric (ILD) material 104. The ILD material 104 can have a planar top surface. Middle of the line (MOL) contacts can extend vertically through the ILD material 104 to the one or more of the optical and/or electronic devices, as needed.

In such a SOI chip structure 100, the maximum height of the core layer of the Si waveguide 113 is limited by a critical dimension (CD) associated with the Si layer 106. Specifically, the maximum height of the core layer of the Si waveguide 113 is limited by the maximum allowable height of the Si layer within the optical device area 110. Furthermore, the maximum height of the SiN core layer of the SiN waveguide 114 is limited, at least in part, by a critical dimension (CD) associated with the MOL contacts. Specifically, one CD of the MOL contacts is the maximum allowable height, which is set to minimize contact resistance. Since the MOL contacts have a maximum height, since the MOL contacts and the ILD material 104 through which those MOL contacts extend have co-planar top surfaces, and since the SiN core layer of the SiN waveguide 114 is embedded within the ILD material 104, then the maximum height of the SiN core layer can be no more than the height of the ILD material 104 above the top of the Si layer 106 within the optical device area 110. Unfortunately, since the dimensions of the core layer of an optical waveguide determines the properties of the optical waveguide, including the cut-off wavelength (i.e., the maximum wavelength of any optical signals that can be propagated by the waveguide), any limitations on the dimensions of the core layer also impact functionality.

In view of the foregoing, disclosed herein are embodiments of a silicon-on-insulator (SOI) chip structure with a substrate-embedded optical waveguide. Also disclosed herein are method embodiments for forming the SOI chip structure. In the method embodiments, a substrate-embedded optical waveguide (referred to herein as a first waveguide) is formed within a trench in a bulk substrate prior to a wafer bonding process that results in the SOI structure. Subsequently, front-end-of-the-line (FEOL) processing can be performed to form additional optical devices and/or electronic devices in and/or above the silicon layer. By embedding an optical waveguide within the substrate prior to wafer bonding as opposed to forming it during FEOL processing, strict limitations on the dimensions of the core layer of the optical waveguide are avoided. The core layer of the substrate-embedded optical waveguide can be relatively large and, as a result, the cut-off wavelength can be relatively long. Thus, such a substrate-embedded optical waveguide brings different functionality to the SOI chip structure as compared to any FEOL optical waveguides. Furthermore, because the core layer of the substrate-embedded optical waveguide is relatively large, improved coupling with an off-chip optical fiber can be achieved.

Figure 2A:
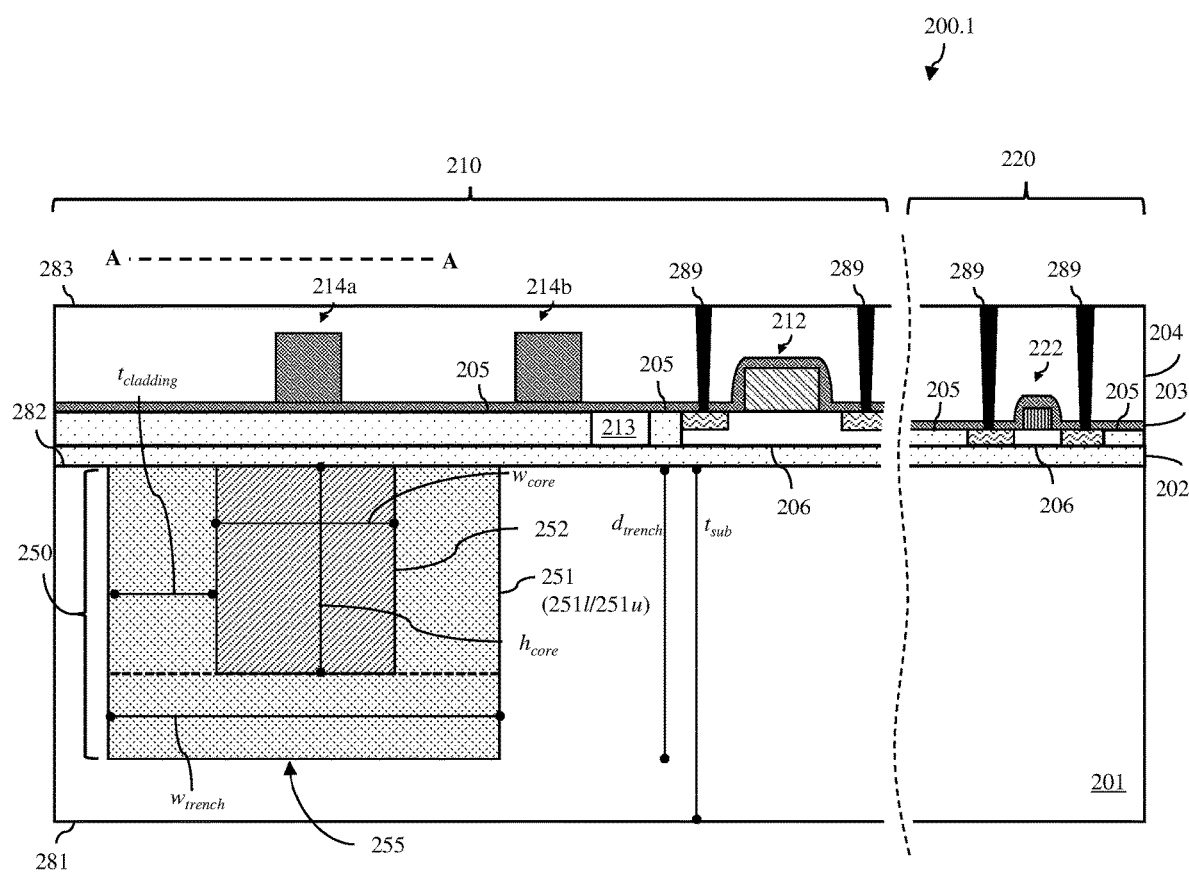
FIGS. 2A-2B are different cross-section diagrams AA and BB, respectively, illustrating an embodiment of a silicon-on-insulator (SOI) chip structure with a substrate-embedded optical waveguide.
Figure 2B:
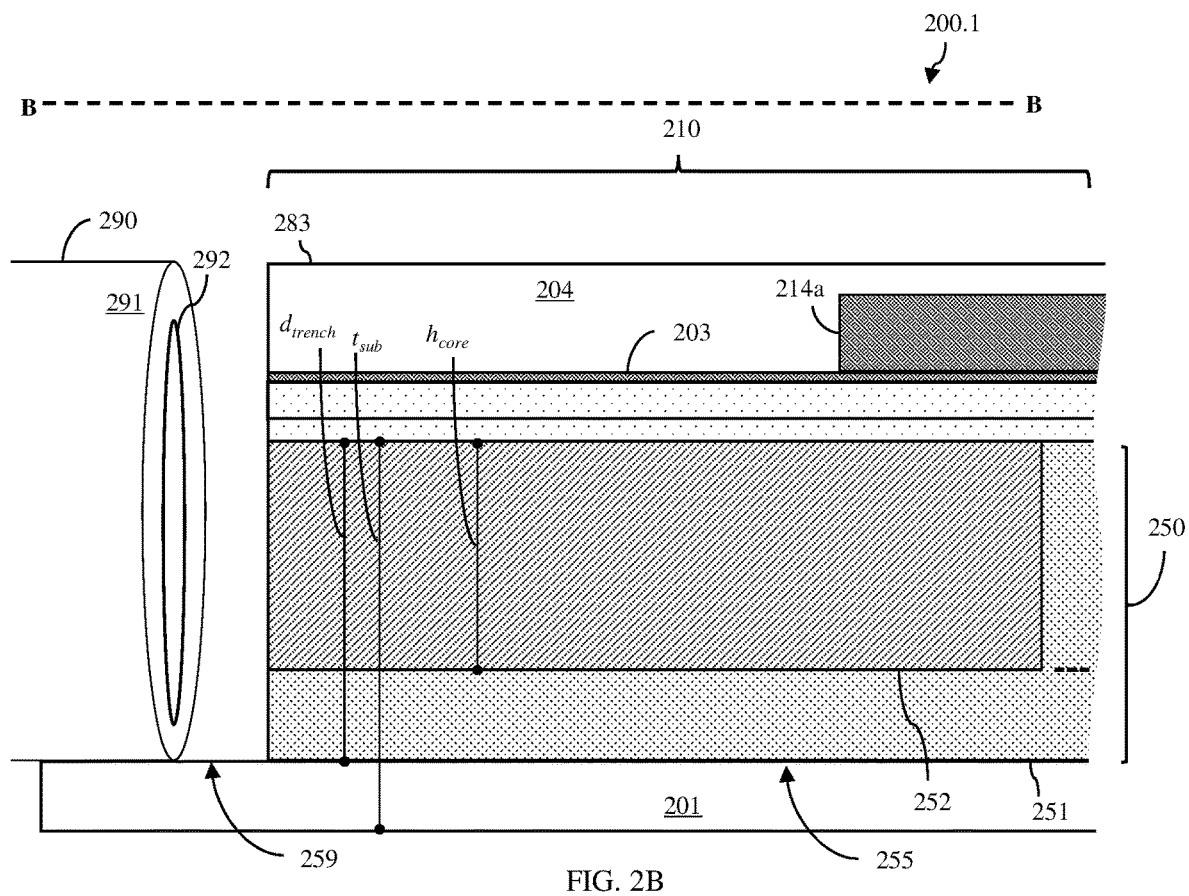
Figure 2C:
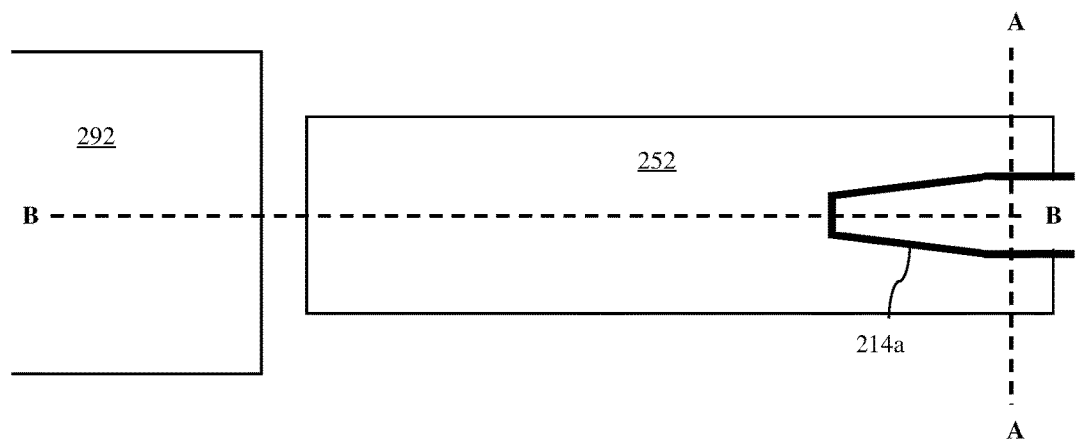
FIG. 2C is an exemplary layout diagram showing the orientations of the cross-section diagrams AA and BB of FIGS. 2A-2B (mentioned above) and FIGS. 3A-3B (mentioned below)
Figure 3A:
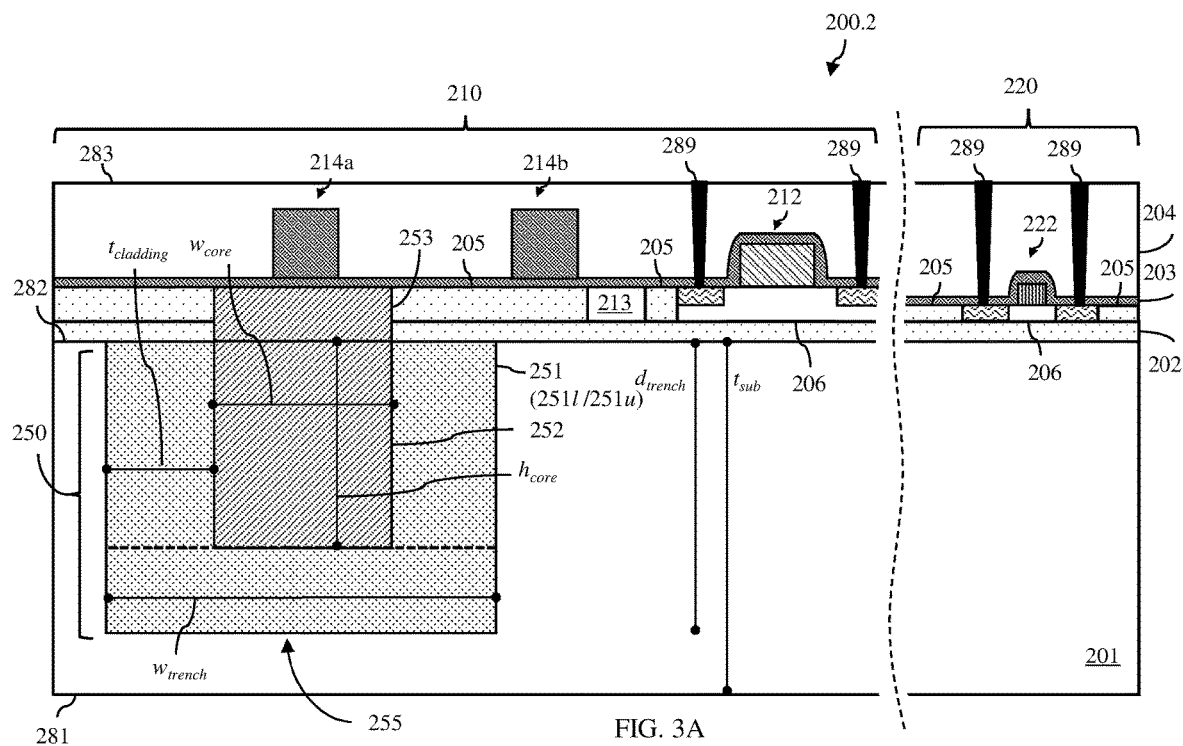
FIGS. 3A-3B are different cross-section diagrams AA and BB, respectively, illustrating another embodiment of an SOI chip structure with a substrate-embedded optical waveguide.
Figure 3B:
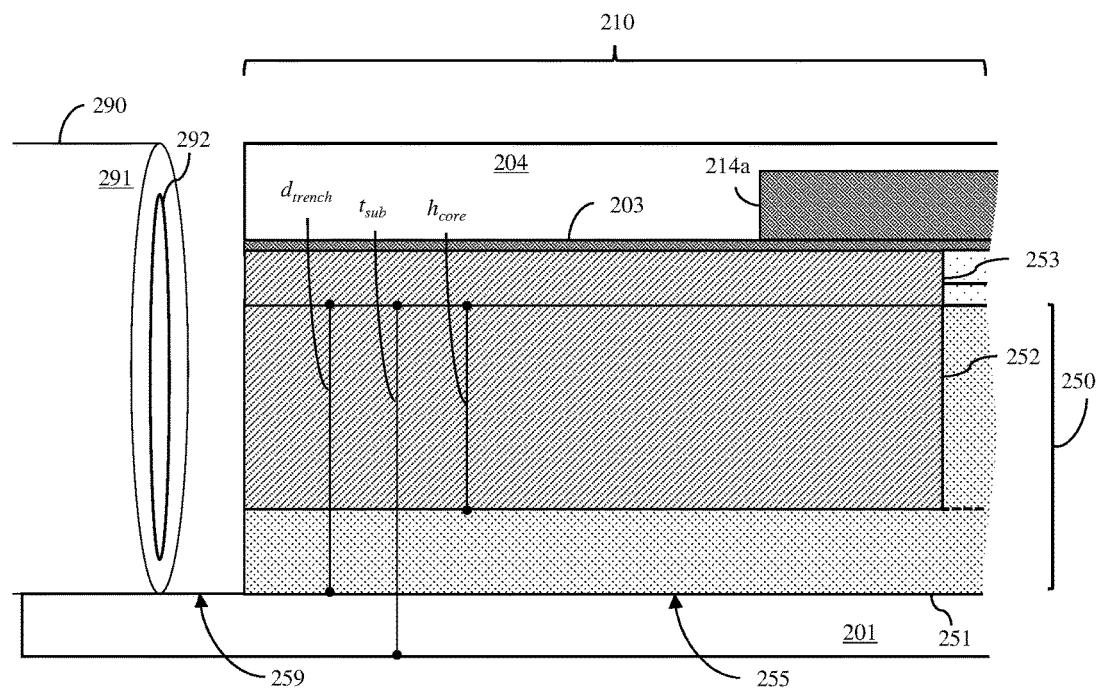
Figure 4:
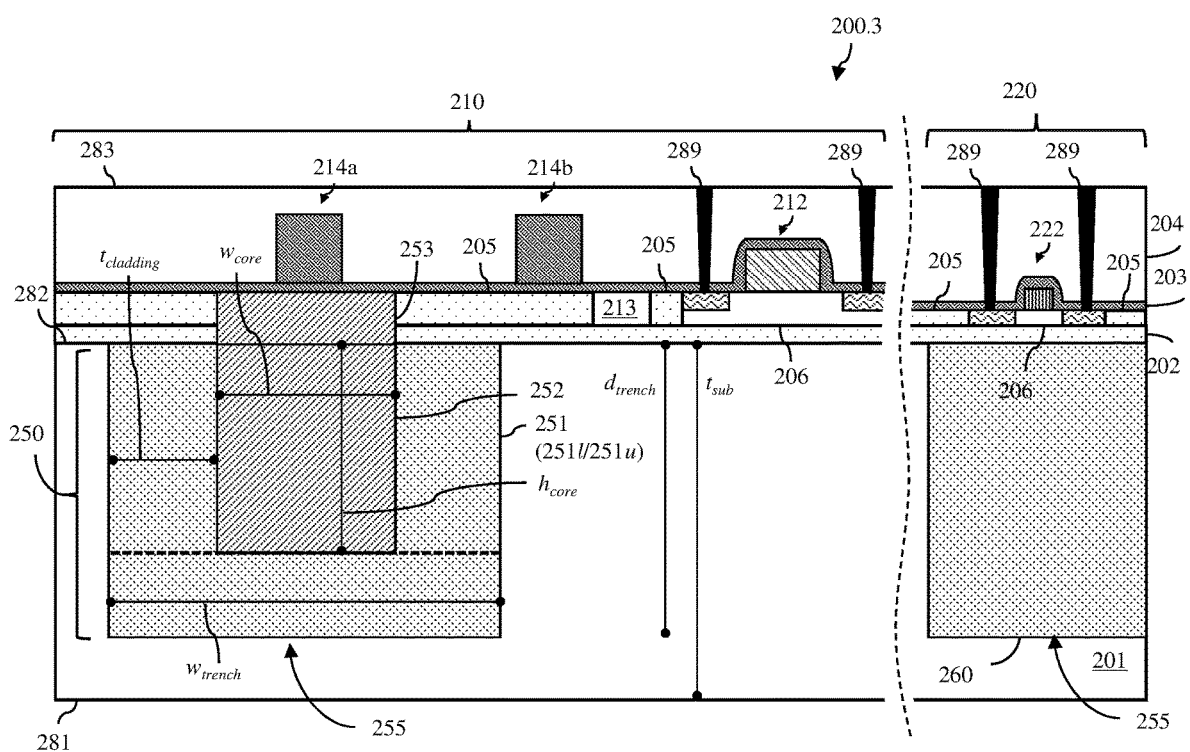
FIG. 4 is a cross-section diagram illustrating yet another embodiment of an SOI chip structure with a substrate embedded optical waveguide.

More particularly, disclosed herein are various embodiments of a silicon-on-insulator (SOI) chip structure 200.1-200.3, each of which includes at least one first waveguide 250 and, particularly, a substrate-embedded optical waveguide. Specifically, FIGS. 2A-2B are different cross-section diagrams AA and BB, respectively, illustrating a silicon-on-insulator (SOI) chip structure 200.1. FIG. 2C is an exemplary layout diagram showing the orientations of the cross-section diagrams AA and BB. FIGS. 3A-3B are different cross-section diagrams AA and BB, respectively, illustrating an alternative SOI chip structure 200.2. It should be noted that the orientations of the cross-section diagrams AA and BB in FIGS. 3A and 3B are essentially the same as those shown in FIG. 2C. FIG. 4 is a cross-section diagram AA illustrating yet another alternative SOI chip structure 200.3.

The SOI chip structure 200.1-200.3 can include a substrate 201. This substrate 201 can be, for example, a silicon (Si) substrate. Alternatively, the substrate 201 could be any other substrate suitable for an SOI chip structure. This substrate 201 can have a bottom surface 281 and a top surface 282 opposite the bottom surface. The bottom surface 281 and the top surface 282 can be essentially planar and parallel to each other. The thickness of the substrate 201 ($t_{sub}$), as measured from the bottom surface 281 of the substrate 201 to the top surface 282 of the substrate 20, can range from, for example, 1 micron (μm) to 10 μm or even larger (e.g., 50 μm, 100 μm, 150 μm, 200 μm or higher).

The SOI chip structure 200.1-200.3 can further include at least one first waveguide 250 and, particularly, a substrate-embedded optical waveguide. Specifically, a trench 255 can extend into the substrate 201 from the top surface 282 toward the bottom surface 281. The size of the trench 255 (including the depth of the trench 255 ($d_{trench}$), as measured from the top surface 282 of the substrate 201 to the bottom of the trench 255) can vary depending upon the particular application and the thickness of the substrate 201 ($t_{sub}$). For example, in some embodiments, the trench 255 can be relatively shallow (e.g., the depth of the trench 255 can be less than ¼ the thickness of the substrate 201). In other embodiments, the trench 255 can be relatively deep (e.g., the depth of the trench 255 can be greater than ¼, ½, ¾, etc. the thickness of the substrate 201). Thus, depending upon the thickness of the substrate 201, the depth of the trench 255 could range from less than 1 micron (μm) up to 10 μm or even larger (e.g., 50 μm, 100 μm, 150 μm, 200 μm or higher).

The first waveguide 250 can be, at least primarily, contained within this trench 255. That is, the first waveguide 250 can include a cladding layer 251. The cladding layer can line the bottom surface and the sidewalls of the trench 255. The first waveguide 250 can further include a core layer 252 centered on a horizontal portion of the cladding layer 251 and laterally surrounded by the cladding layer 251. Thus, bottom and side surfaces of the core layer 252 are wrapped by the cladding layer 251. It should be understood that the dimensions of the core layer 252 will vary depending upon the dimensions of the trench 255 as well as the thickness of the cladding layer 251 ($t_{cladding}$). For example, if the depth of the trench 255 ($d_{trench}$) is approximately 60 μm, the width of the trench ($w_{trench}$) is approximately 60 μm, and the thickness of the cladding layer 251 ($t_{cladding}$) is approximately 20 μm, then the width of the core layer 252 ($w_{core}$) will be approximately 20 μm and the height of the core layer 252 ($h_{core}$) will be approximately 40 μM.

In any case, the cladding layer 251 for the first waveguide 250 can be made of a cladding material with a first refractive index and the core layer 252 can be made of a core material with a second refractive index that is greater than the first refractive index to allow for optical signal propagation through the waveguide 250. In some embodiments, the cladding material of the cladding layer 251 can be an oxide material, such as silicon dioxide, with a refractive index of less than 2.0 and, more particularly, less than 1.6. In other embodiments, the cladding material of the cladding layer 251 could be a different oxide material or some other suitable cladding material with a similarly low refractive index and, particularly, with a first refractive index that is less than the second refractive index of the core material. In some embodiments, the core material of the core layer 252 of the first waveguide 250 could be a nitride material, such as silicon nitride (SiN), with a refractive index of greater than 2.0. In other embodiments, the core material of the core layer 252 could be an oxide material, which is different from that used for the cladding material and which similarly has a relatively high refractive index. For example, in some embodiments, the core material of the core layer 252 could be niobium oxide (NbO) with a refractive index of approximately 2.2 or higher. In other embodiments, the core material of the core layer 252 could be any other suitable core material with a similarly high refractive index and, particularly, with a second refractive index that is greater than the first refractive index of the cladding material.

As discussed in greater detail below with regard to the method, in some embodiments the cladding layer 251 can be a continuous or single layer of the cladding material that lines the bottom surface and sidewalls of the trench 255. In other embodiments, the cladding layer 251 can be a multi-layer cladding layer. For example, the cladding layer 251 could include a lower cladding layer 251*l*, which covers the bottom surface of the trench 255. The bottom of the core layer 252 can be immediately adjacent to, narrower than, and essentially centered upon the lower cladding layer 251*l* such that outer edges of the lower cladding layer 251*l* extend laterally beyond the side surfaces of the core layer 252. The cladding layer 251 can further include an upper cladding layer 251*u*, which is above and immediately adjacent to the outer edges of the lower cladding layer 251*l* and which extends upward along the sidewalls of the trench 255 such that it is further positioned laterally between and immediately adjacent to the sidewalls of the trench 255 and side surfaces of the core layer 252. In some embodiments, the lower cladding layer 251*l* and the upper cladding layer 251*u* can be made of the same cladding material (see discussion of cladding materials above). In other embodiments, the lower cladding layer 251*l* and the upper cladding layer 251*u* can be made of different cladding materials (as long as both have refractive indices that are less than the refractive index of the core material) (see also the discussion of the cladding materials above).

The SOI chip structure 200.1-200.3 can further include an insulator layer 202 on the top surface 282 of the substrate 201. This insulator layer 202 can be, for example, a silicon dioxide layer (also referred to herein as a buried oxide (BOX) layer) or any other suitable insulator layer. It should be noted that the thickness of the insulator layer 202 can be vary depending upon the application and the technology node. For example, the thickness of the insulator layer 202 can range from less than 100 nm to 0.5 µm or higher (e.g., approximately 2 µm). This insulator layer 202 can cover the top surface 282 of the substrate 201 and can further extend laterally over any embedded structures within the substrate 201 (e.g., over each first waveguide 250).

The SOI chip structure 200.1-200.3 can have one or more different device areas. The device areas can include, for example, an electronic device area 220 and an optical device area 210. The SOI chip structure 200.1-200.3 can further include a silicon layer 206 (and, particularly, a monocrystalline silicon layer) on the insulator layer 202 and extending laterally across and covering the insulator layer 202 in each device area. In some embodiments, the Si layer 206 can be thinner within the electronic device area 220 than it is within the optical device area 210. For example, in some embodiments, the thickness of the silicon layer 206 within the electronic device area 220 can be between 10 nm and 100 nm (e.g., approximately 88 nm) and the thickness of the Si layer 206 within the optical device area 210 can be between 125 nm and 175 nm (e.g., approximately 150 nm or 160 nm).

The SOI chip structure 200.1-200.3 can further include isolation regions and, particularly, shallow trench isolation (STI) regions 205 within the Si layer 206. The STI regions 205 can include shallow trenches that extend fully through the Si layer 206 to the insulator layer 202. Each of these shallow trenches can be filled with one or more layers of isolation material. The isolation material of the STI regions 205 can be silicon dioxide or any other suitable isolation material. It should be noted that, if the Si layer 206 is thicker within the optical device area 210 as compared to in the electronic device area 220, the STI regions 205 within the optical device area 210 will also be thicker. The STI regions 205 can be patterned during processing so that they define the boundaries of and isolate devices, as necessary, within and between the various device areas. One STI region 205 can specifically be within the Si layer 206 in the optical device area 210 and aligned above the first waveguide 250. This STI region 205 and the insulator layer 202 can provide additional cladding for the first waveguide 250.

The SOI chip structure 200.1-200.2 can further include one or more front-end-of-the-line (FEOL) electronic devices in the electronic device area 220. Exemplary FEOL electronic devices can include active semiconductor devices and/or passive semiconductor devices. Active semiconductor devices can include, for example, complementary metal oxide semiconductor (CMOS) devices (e.g., one or more field effect transistors (FETs) 222, as illustrated) or any other suitable type of active semiconductor device. Passive semiconductor devices could include, resistors, capacitors, etc. Such FEOL electronic devices are well known in the art and, thus, the details thereof have been omitted from this specification in order to allow the reader to focus on the salient aspects of the disclosed embodiments.

As mentioned above, the first waveguide 250 (i.e., the substrate-embedded optical waveguide) can be within the substrate 101 in the optical device area 210. Optionally, the SOI chip structure 200.1-200.3 can further include one or more FEOL optical devices, which are also within the optical device area 210 but above the insulator layer 202. Exemplary FEOL optical devices that could be incorporated into the SOI chip structure 200.1-200.3 include any of the following: one or more second waveguides 214*a*-214*b*, one or more third waveguides 213, one or more photodetectors 212, and/or any other suitable FEOL optical device.

More specifically, the SOI chip structure 200.1-200.3 could include a third waveguide 213. This third waveguide 213 can be a Si optical waveguide, which includes a Si core that comprises a portion of the Si layer 206 and that has length and width dimensions defined by STI regions 205. Dimensions of the core layer of the third waveguide 213

(e.g., particularly height and width) can be significantly less than dimensions of the core layer of the first waveguide 250 (see also the discussion of critical dimensions (CDs) below). Cladding for the third waveguide 213 can be made up of the dielectric materials immediately adjacent to the Si core layer (e.g., in the laterally adjacent STI regions, in the insulator layer 202 below, and in ILD materials 204 above). The SOI chip structure 200.1-200.3 could further include other types of FEOL optical devices such as a photodetector 212 (e.g., a germanium photodetector) and/or an optical signal modulator. Each of these FEOL optical devices can include portions of the Si layer 206 within the optical device area 210. Photodetectors and optical signal modulators are well known in the art and, thus, the details of these devices have been omitted from this specification in order to allow the reader to focus on the salient aspects of the disclosed embodiments.

The SOI chip structure 200.1-200.3 can further include a conformal etch stop layer 203, which covers some FEOL optical devices, such as the third waveguide 213, the photodetector 212, and the modulators within the optical device area 210. This etch stop layer 203 can further cover the FEOL electronic devices in the electronic device area 220 as well as the STI regions 205 within and between the device areas 210, 220. The etch stop layer 203 can be, for example, a silicon nitride (SiN) etch stop layer.

The SOI chip structure 200.1-200.3 can further include one or more second waveguides 214a-214b within the optical device area 210. The core layer for each second waveguides 214a-214b can be above the etch stop layer 203 and aligned above an STI region 205 (as discussed in greater detail below). Dimensions of the core layer of each second waveguide 214a-214b (e.g., particularly height and width) can be significantly less than dimensions of the core layer of the first waveguide 250 (see also the discussion of critical dimensions (CDs) below). The SOI chip structure 200.1-200.3 can further include one or more layers of interlayer dielectric (ILD) material 204 on the etch stop layer 203 and extending laterally over and covering the core layer for each second waveguide 214a-214b. The ILD material 204 can include, for example, doped silicon glass (e.g., phosphosilicate glass (PSG) or borophosphosilicate glass (BPSG)), silicon dioxide, or any other suitable ILD material. In any case, this ILD material 204 should have a relatively low refractive index (e.g., a refractive index of lower than 2.0) to allow it to be employed as cladding material for the second waveguides 214a-214b. The ILD material 204 can have a planar top surface 283, which is essentially parallel to the planar bottom and top surfaces 281-282 of the substrate 201.

The core layer of each second waveguide 214a-214b can have a refractive index that is greater than the refractive indices of the surrounding dielectric materials (e.g., of the isolation material in the STI region 205 below and the ILD material 204 to the sides and above). In some embodiments, the core layer of each second waveguide 214a-214b can be SiN with a refractive index that is greater than 2.0.

The core layer 252 of the first waveguide 250 (i.e., of the substrate-embedded optical waveguide) can be an elongated structure with first ends. Similarly, the core layer of each second waveguide 214a-214b can be an elongated structure with second ends. In some embodiments, one of the second ends of the core layer of one of the second waveguides (e.g., see the second waveguide 214a) can overlay one of the first ends of the core layer 252 of the first waveguide 250 (e.g., see the layout diagram of FIG. 2C). This configuration potentially enables evanescent-wave coupling between the two waveguides (i.e., between the first waveguide 250 and the second waveguide 214a). Those skilled in the art will recognize that "evanescent-wave coupling between waveguides" refers to placement of two waveguides in sufficiently close proximity so that an evanescent field generated by waveguide excites a wave in the adjacent waveguide. However, depending upon the core and cladding materials in the two waveguides (i.e., in the first waveguide 250 and the second waveguide 214a) and further depending upon the separation distance between the core layers of the two waveguides, evanescent-wave coupling may not be achievable. In this case, the SOI chip structure and, particularly, the SOI chip structure 200.2 and 200.3 can further include a waveguide extender 253. This waveguide extender 253 can extend through the STI region 205 and the insulator layer 202 down to the core layer 252 of the first waveguide 250 such that a first end of the core layer 252 of the first waveguide 250 and a second end of the core layer of the second waveguide 214a each contact the waveguide extender 253 (as shown), thereby providing the needed coupling. Alternatively, the waveguide extender 253 could extend only partially through the STI region 205 and, optionally, the insulator layer 202 such that the proximity of the waveguide extender 253 to the first end of the core layer 252 of the first waveguide 250 is sufficient to enable evanescent-wave coupling. This waveguide extender 253 could be made, for example, of the same core material as the core layer 252 of the first waveguide 250, of the same core material as the core layer of the second waveguide 214a, or of some other suitable core material.

Alternatively, the core layer 252 of the first waveguide 250 and the core layer of a second waveguide (e.g., see the second waveguide 214b) can be completely offset. For example, as illustrated, no portion of the core layer of the second waveguide 214b overlays the core layer of the first waveguide 250.

Optionally, the SOI chip structure (e.g., see the SOI chip structure 200.3 of FIG. 4) can further include one or more additional isolation regions 260 and, particularly, one or more substrate-embedded isolation regions within the electronic device area 220. For example, the substrate 201 can have an additional trench 265. This additional trench 265 can be within the electronic device area 220 and, like the trench 255, can extend from the top surface 282 of the substrate 201 toward the bottom surface 281. The size of the additional trench 265 (including the depth of the additional trench 265 as measured from the top surface 282 of the substrate 201 to the bottom of the additional trench 265) can vary depending upon the particular application and the thickness of the substrate 201 ($t_{sub}$). For example, in some embodiments, the additional trench 265 can be relatively shallow (e.g., the depth of the additional trench can be less than ¼ the thickness of the substrate 201). In other embodiments, the additional trench 265 can be relatively deep (e.g., the depth of the additional trench 265 can be greater than ¼, ½, ¾, etc. the thickness of the substrate 201). Thus, depending upon the thickness of the substrate 201, the depth of the additional trench 265 could range from less than 1 micron (μm) up to 10 μm or even larger (e.g., 50 μm, 100 μm, 150 μm, 200 μm or higher). In any case, the bottoms of the trenches 255 and 265 can be at the same level below the top surface 282 of the substrate 201 (as illustrated). Alternatively, the bottoms of the trenches 255 and 265 can be at different levels below the top surface 282 of the substrate 201. Isolation material(s) can fill the additional trench 265, thereby forming an isolation region 260 (i.e., a substrate-embedded isolation region). The isolation material that fills the additional trench 265 can, for example, be the same material as that used for the cladding material of the cladding layer 251 (or, if applicable, the same cladding material used for either the lower or upper layers of a multi-layer cladding layer). Such a substrate-embedded isolation region can reduce parasitic capacitance. Furthermore, when/if the electronic device(s) in the electronic device area 220 are to be employed for radio frequency (RF) applications, having a substrate-embedded isolation region 260 aligned below the electronic device(s) (as illustrated in the SOI chip structure 200.3 of FIG. 4) can provide improved reduction of harmonics. It should be noted that, by employing local substrate-embedded isolation regions below specific chip components, the need for a thick insulator layer 202 (i.e., a thick BOX layer) in some technologies can be eliminated.

The SOI chip structure 200.1-200.3 can further include middle-of-the-line (MOL) contacts 289. These MOL contacts 289 can extend vertically through the ILD material 204 to optical and electronic devices, as needed. For example, MOL contacts 289 can land on terminals of the photodetector 212, FET 222, etc.

In the SOI chip structure 200.1-200.3, the maximum height of the core layer of the third waveguide 213 (e.g., the Si optical waveguide) is limited by a critical dimension (CD) associated with the Si layer 206. Specifically, the maximum height of the core layer of the third waveguide 213 is limited by the maximum allowable height of the Si layer 206 within the optical device area 210. As mentioned above, the thickness of the Si layer 206 within the optical device area 210 can be between 125 nm and 175 nm (e.g., approximately 150 nm or 160 nm). Furthermore, the maximum height of the core layer of each second waveguide 214a-214b is limited, at least in part, by a critical dimension (CD) associated with the MOL contacts 289. Specifically, one CD of the MOL contacts 289 is the maximum allowable height, which is set to minimize contact resistance. Since the MOL contacts 289 have a maximum height, since the MOL contacts and the ILD material 204 through which those MOL contacts extend have co-planar top surfaces, and since the core layer of each second waveguide 214a-214b is embedded within the ILD material 204, then the maximum height of the core layer of each second waveguide 214a-214b can be no more than the height of the ILD material 204 above the top of the Si layer 206 within the optical device area 210. For example, in some embodiments, the maximum height of the core layer of each second waveguide 214a-214b (e.g., each SiN waveguide) above an STI region 205 can be 300 nm. Since the dimensions of the core layers of waveguides determine the properties of those waveguides, including the cut-off wavelength (i.e., the maximum wavelength of any optical signals that can be propagated by the waveguide), the above-described limitations placed on the dimensions of the core layers of any second waveguides 214a-214b or the third waveguides 213 also limit their functionality. However, because the first waveguide 250 is embedded within the substrate 201, it is not limited by CDs associated with front-end-of-the-line (FEOL) or middle-of-the-line (MOL) features. Thus, the dimensions of the core layer 252 of the first waveguide 250 (which can potentially be measured in the tens or hundreds of microns (μm) depending upon the thickness of the substrate 201) can be significantly larger than the dimensions of the core layers of any second waveguides 214a-214b and/or third waveguides 213 (which are typically measured in hundreds of nanometers (nm)). Thus, the first waveguide 250 will have a significantly higher cut-off wavelength than any second waveguides 214a-214b or third waveguides 213 and will bring a different functionality to the SOI chip structure as compared to the second and third waveguides.

Furthermore, because the core layer 252 of the first waveguide 250 is relatively large, improved coupling with an off-chip optical fiber can be achieved. More specifically, as illustrated in FIGS. 2B and 3B, the SOI chip structure 200.1-200.3 can further include a V-shaped groove 259 in the substrate 201 at one side. This V-shaped groove 259 can be configured to receive an off-chip optical fiber 290. The optical fiber 290 can include a cylindrical core layer 292 and a cladding layer 291 wrapped around the core layer 292. As mentioned above, one first end of the core layer 252 of the first waveguide 250 can be aligned below one second end of the core layer of a second waveguide 214a. In this case, the opposite first end of the core layer 252 of the first waveguide 250 can extend to and be exposed at the groove 259 so that the core layer 252 of the first waveguide 250 and the core layer 292 of the optical fiber 290 are in end-to-end alignment. Since the dimensions of the core layer 252 of the first waveguide 250 can be relatively large, the core layer 252 can be designed so as to have one or more dimensions (e.g., height or height and width) that match or at least approximate corresponding dimension(s) of the core layer 292 of the optical fiber, thereby improving coupling between an off-chip optical fiber and an on-chip waveguide.

Figure 5:
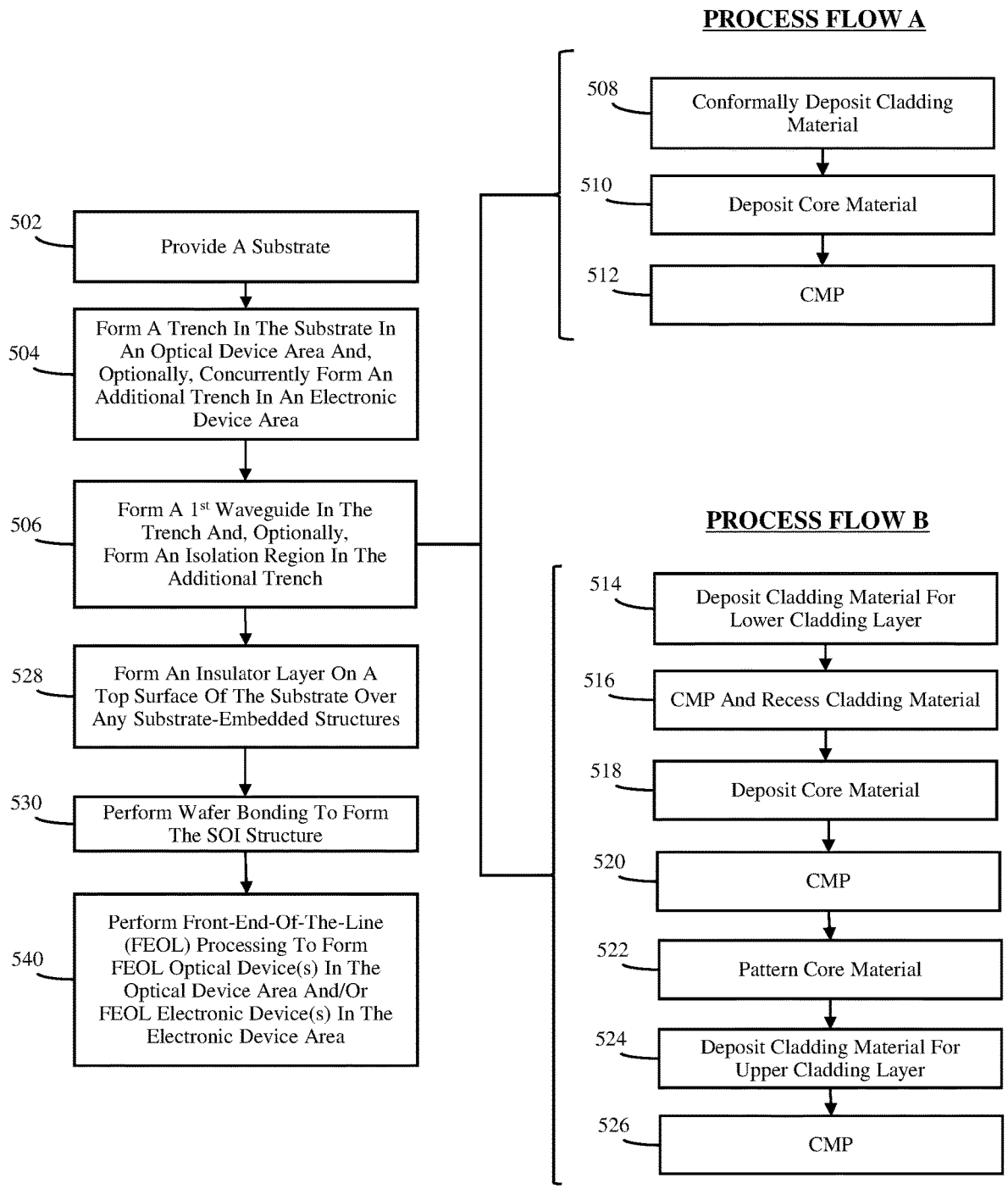
FIG. 5 is a flow diagram illustrating disclosed method embodiments.

Referring to the flow diagram of FIG. 5, also disclosed herein are method embodiments for forming a silicon-on-insulator (SOI) chip structure having at least one substrate-embedded waveguide (e.g., as illustrated in FIGS. 2A-4 and described in detail above).

Figure 6:
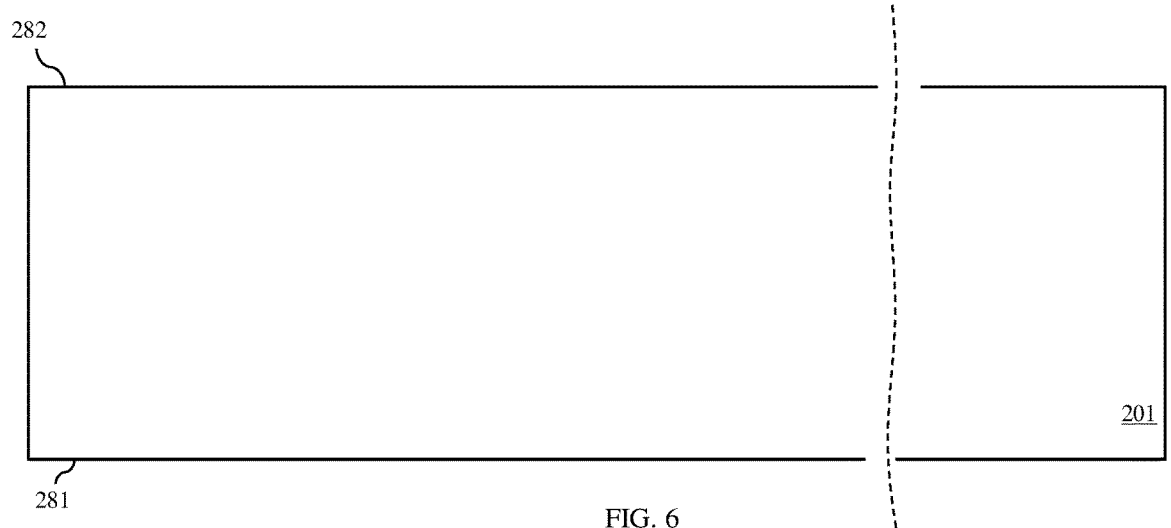
FIGS. 6-7 are cross-section diagrams illustrating partially completed structures formed according to the flow diagram of FIG. 5.

The method can include providing a substrate 201 (see process step 502 and FIG. 6). This substrate 201 can be, for example, a silicon (Si) substrate. Alternatively, the substrate 201 could be any other substrate suitable for an SOI chip structure. This substrate 201 can have a bottom surface 281 and a top surface 282 opposite the bottom surface. The bottom surface 281 and the top surface 282 can be essentially planar and parallel to each other.

The method can further include embedding a first waveguide 250 within the substrate 201 in an optical device area 210 and, optionally, concurrently embedding an isolation region 260 within the substrate 201 in an electronic device area 220.

Figure 7:
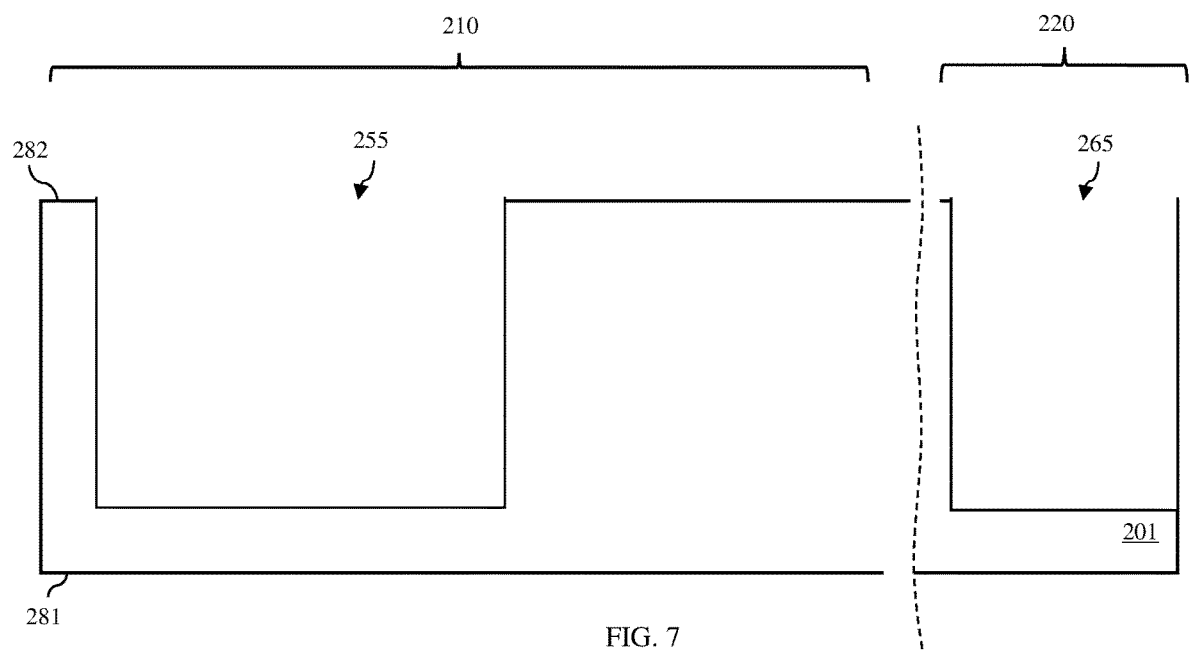

Specifically, using conventional lithographic patterning and etch processes, one or more trenches can be formed in the substrate 201 such that each trench extends from the top surface 282 toward the bottom surface 281 of the substrate 201 (see process step 504 and FIG. 7).

For example, at process step 504, a trench 255 for the first waveguide 250 can be patterned and etched. The depth of the trench 255 ($d_{trench}$) (as measured from the top surface 282 of the substrate 201 to the bottom of the trench 255) can be predetermined depending upon the desired application. For example, the depth of the trench 255 could range from less than 1 micron (μm) up to 10 μm or even larger (e.g., 50 μm, 100 μm, 150 μm, 200 μm or higher).

Optionally, at process step 504, an additional trench 265 for the isolation region 260 can be concurrently patterned and etched. The depth of the additional trench 265 (as measured from the top surface 282 of the substrate 201 to the bottom of the trench 255) can be predetermined depending upon the desired application. For example, the depth of the additional trench 265 could range from less than 1 micron (μm) up to 10 μm or even larger (e.g., 50 μm, 100 μm, 150 μm, 200 μm or higher). In any case, the bottoms of the trenches 255 and 265 can be at the same level below the top surface 282 of the substrate 201 (as illustrated). Alternatively, the bottoms of the trenches 255 and 265 can be at different levels below the top surface 282 of the substrate 201.

The method can further include forming at least one first waveguide 250 within the trench 255 (i.e., a substrate-embedded optical waveguide) and, if applicable, concurrently forming an isolation region 260 within the additional trench 265 (i.e., a substrate-embedded isolation region) (see process step 506). Formation of the first waveguide 250 within the trench 255 and, if applicable, concurrent formation of the isolation region 260 within the additional trench 265 can proceed using any number of different process flows including, but not limited to process flow A and process flow B, which are illustrated in the flow diagram and described in greater detail below.

Figure 8:
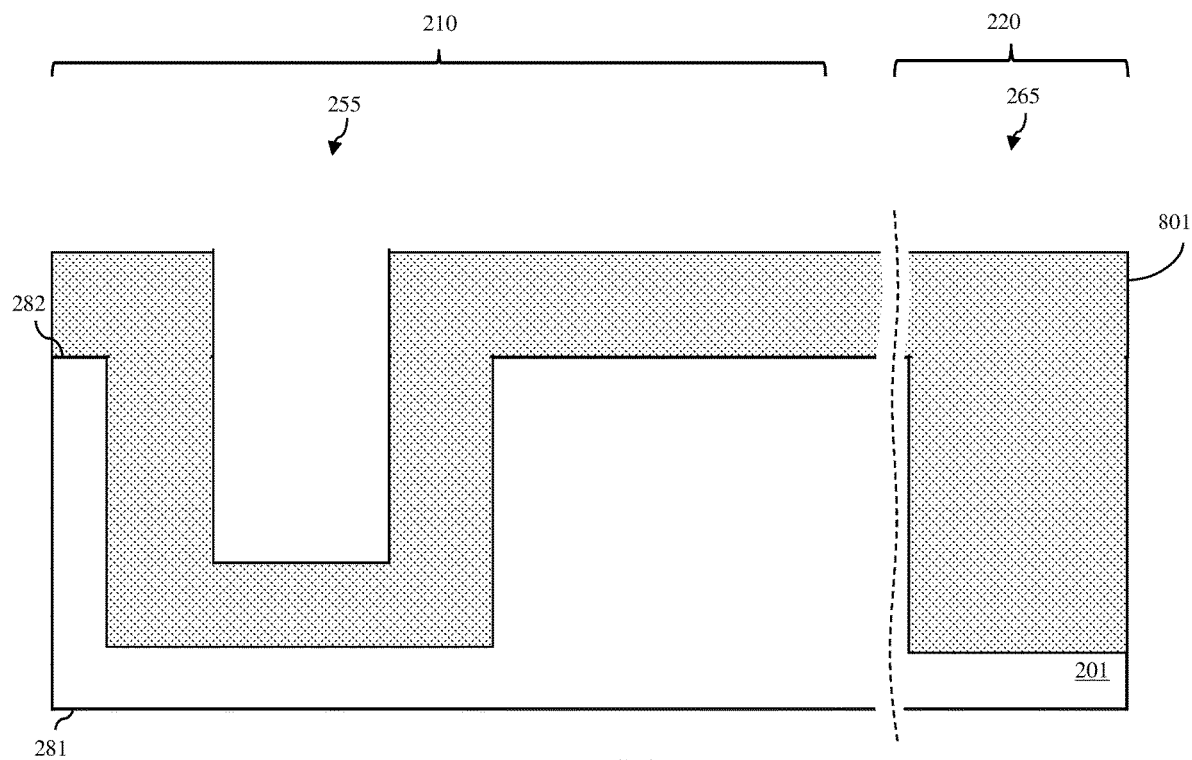
FIGS. 8-10 are cross-section diagrams illustrating partially completed structures formed according to process flow A of the flow diagram of FIG. 5.
Figure 9:
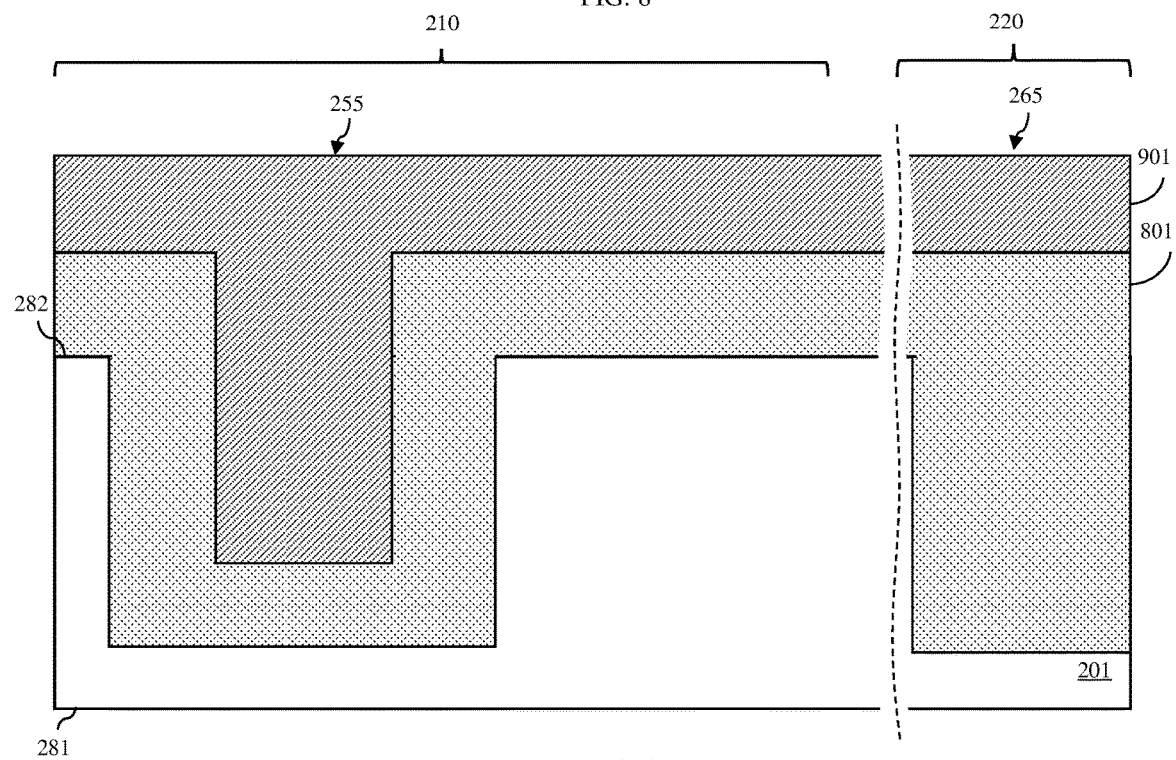
Figure 10:
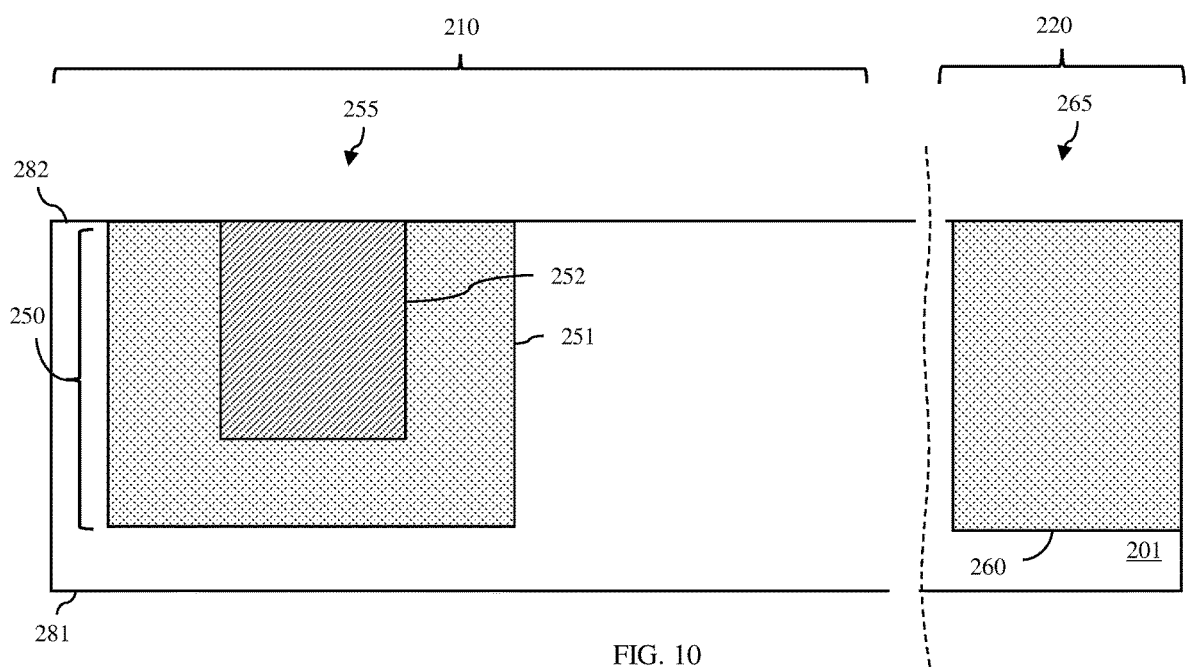

For example, referring to process flow A, cladding material 801 for the first waveguide 250 can be conformally deposited over the top surface 282 of the substrate 101 and into the trench(es) (see process step 508 and FIG. 8). Specifically, a conformal cladding layer can be deposited so that it lines the sidewalls and bottom of the trench 255 without pinching off or filling the trench 255. For example, if the depth of the trench 255 ($d_{trench}$) is approximately 60 μmm and the width of the trench ($w_{trench}$) is approximately 60 μm, and then the thickness of the cladding layer 251 ($t_{cladding}$) can be approximately 20 μm so as to leave sufficient space (e.g., approximately 20 μm) for the core. Next, core material 901 for the first waveguide 250 can be deposited onto the cladding material 801 so as to fill the remaining space within the trench 255 (see process step 510 and FIG. 9). A polishing process (e.g., a conventional chemical mechanical polishing (CMP) process) can then be performed so as to remove the cladding material 801 and core material 901 from the top surface 282 of the substrate 201 (see process step 512 and FIG. 10). As a result, the first waveguide 250 includes a cladding layer 251 and a core layer 252. The cladding layer 251 lines the bottom surface and the sidewalls of the trench 255. The core layer 252 is centered on a horizontal portion of the cladding layer 251 and laterally surrounded by the cladding layer 251. Using process flow A results in cladding layer 251 that is a continuous or single layer of the cladding material that lines the bottom surface and sidewalls of the trench 255 and that wraps the bottom and side surfaces of the core layer 252.

When an isolation region 260 is concurrently being formed using this process flow A, the cladding material (as discussed in greater detail below) should be a suitable isolation material. In this case, the width of the additional trench 265 for the isolation region 260 should be less than the width of the trench 255 for the first waveguide 250. More specifically, the width of the additional trench 265 should be such that, when the cladding material for the first waveguide 250 is deposited, it can completely fill the additional trench 265 (as illustrated). Alternatively, the width of the additional trench 265 should be such that, when the cladding material for the first waveguide 250 is deposited, it can pinch off at the top of the additional trench 265, thereby leaving a space (e.g., an air-gap, a gas-filled gap, a void, etc.) encapsulated within the additional trench 265 (not shown). Thus, when the final CMP process is performed at process step 512, isolation region 260 is completed.

Figure 11:
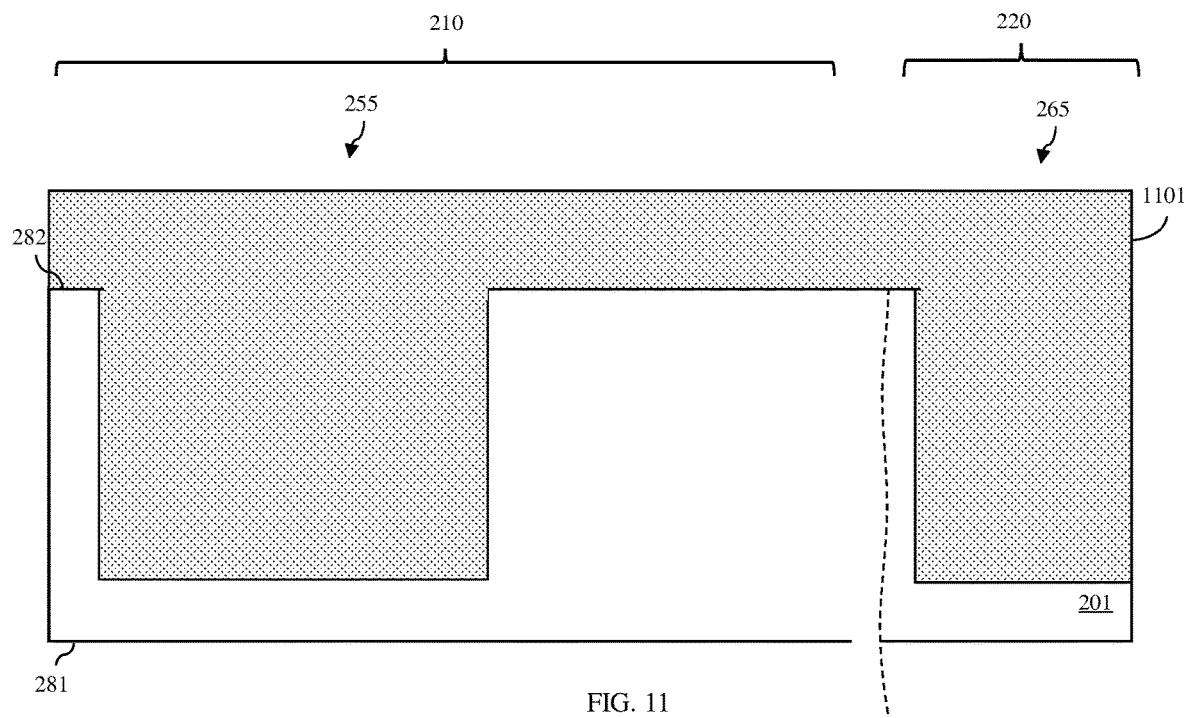
FIGS. 11-21 are cross-section diagrams illustrating partially completed structures formed according to the process flow B of the flow diagram of FIG. 5.
Figure 12:
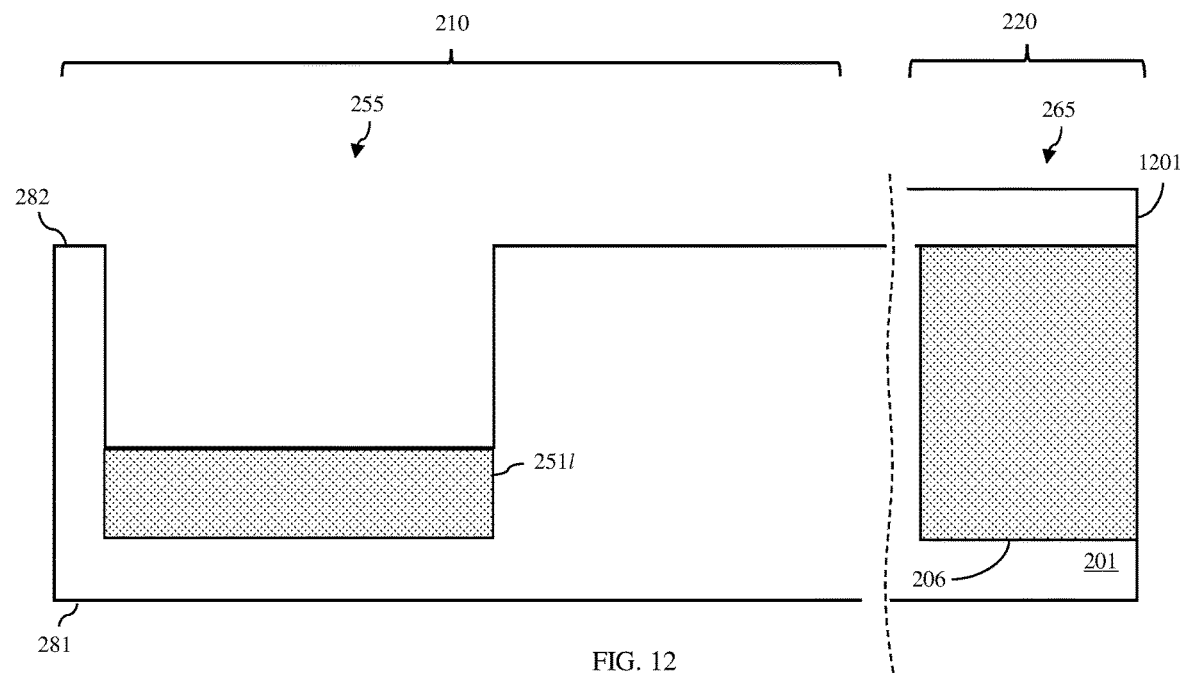
Figure 13:
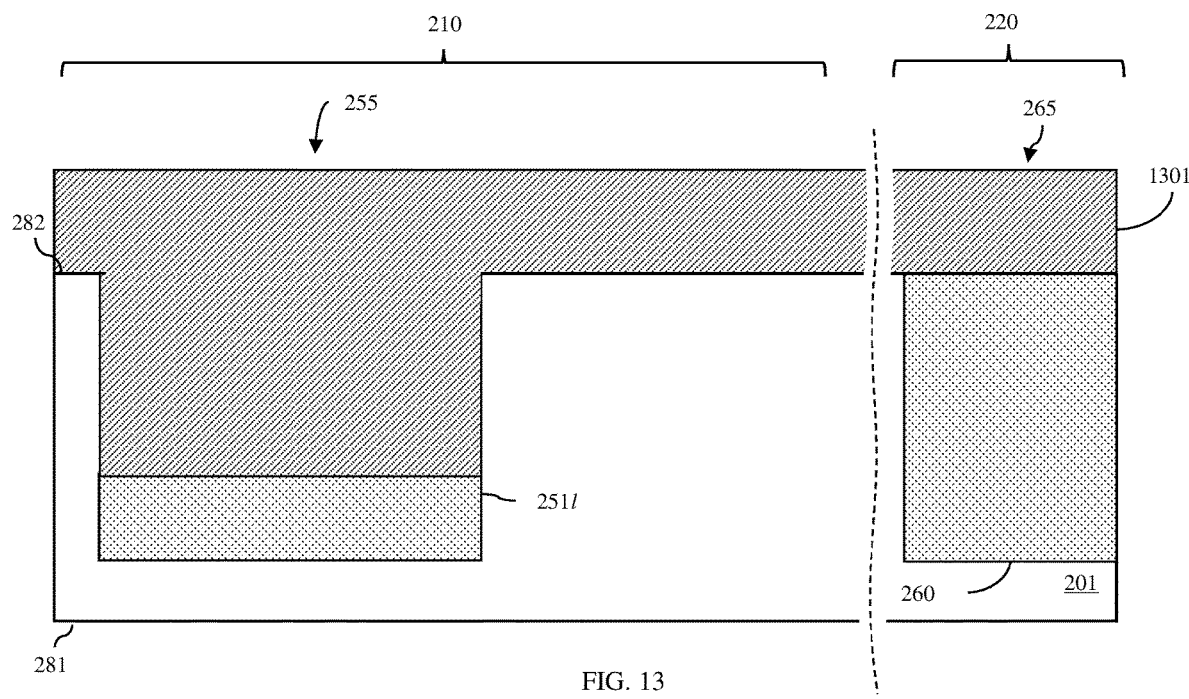
Figure 14:
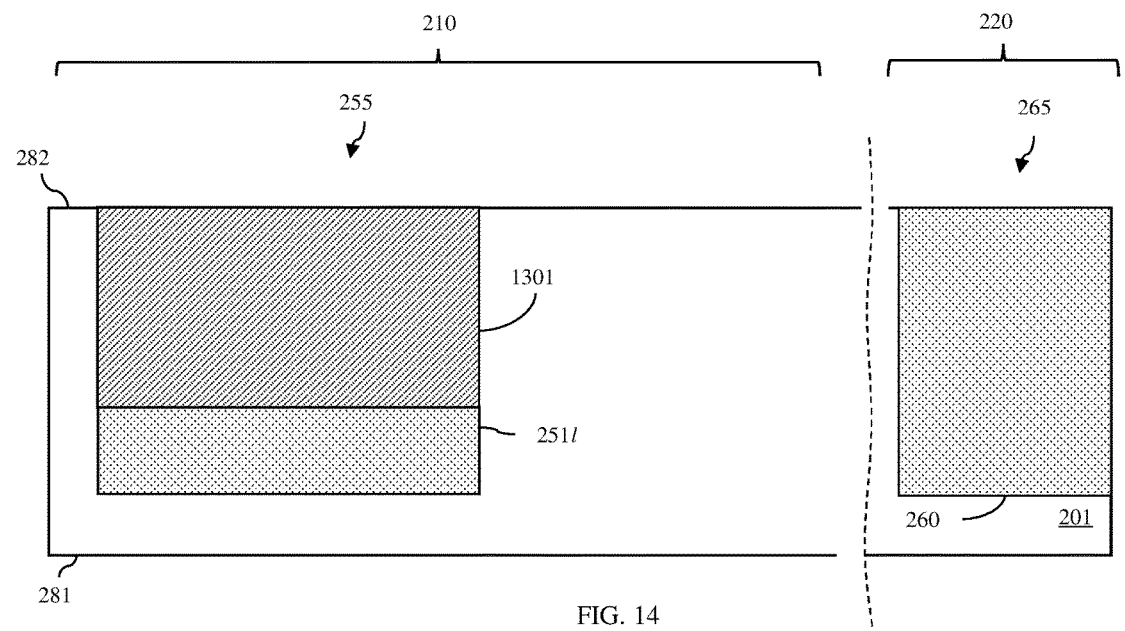
Figure 15:
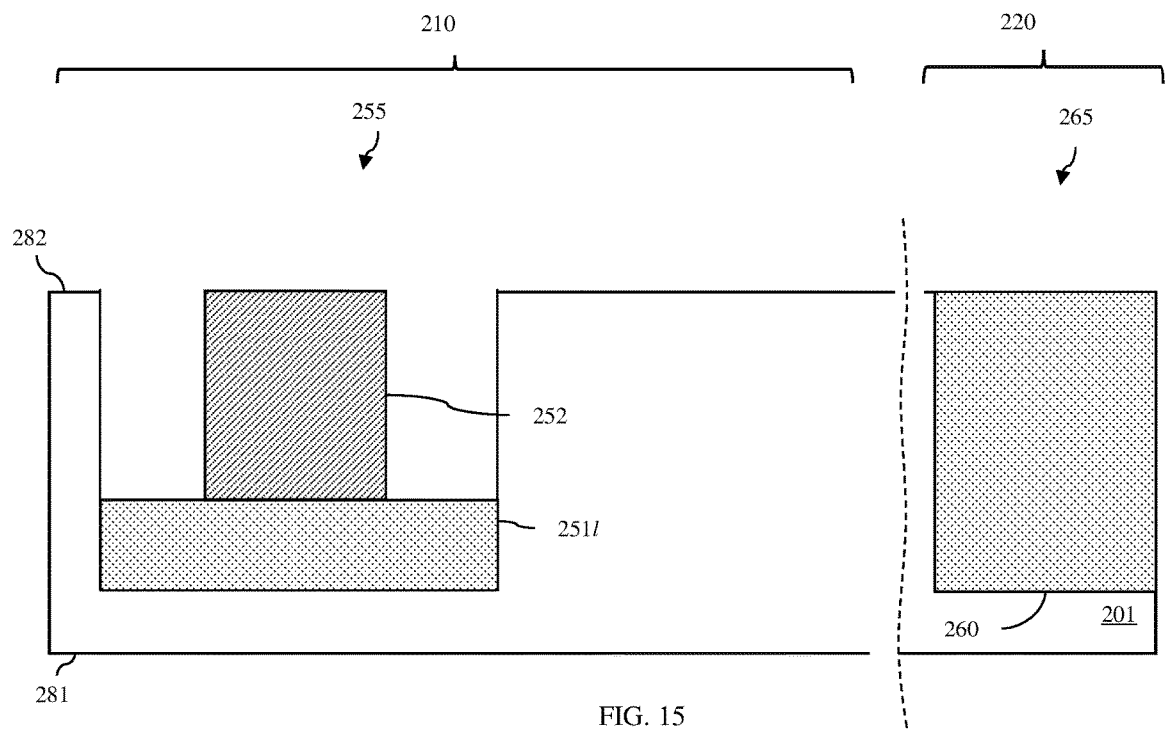
Figure 16:
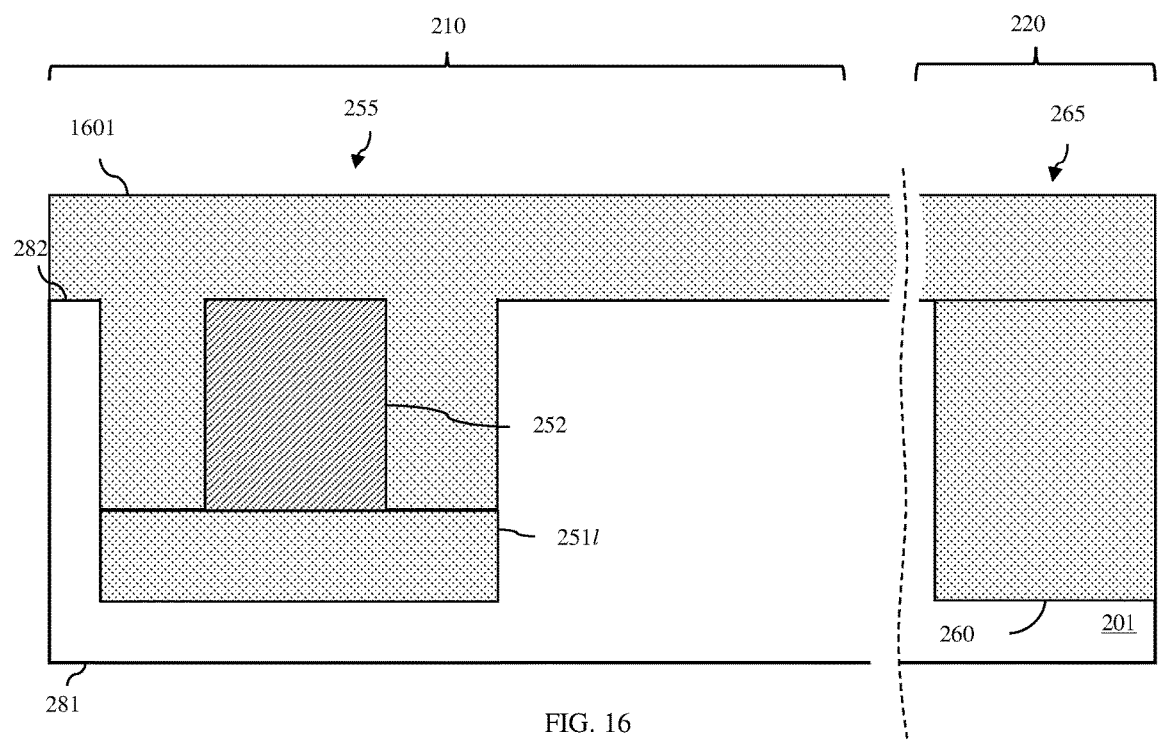

Alternatively, referring to process flow B, cladding material 1101 for a lower cladding layer of the first waveguide 250 can be deposited over the top surface 282 of the substrate 101 and into the trench(es) (see process step 514 and FIG. 11). Specifically, this cladding material 1101 can be deposited so that it fills the trench 255. Next, a polishing process (e.g., a conventional CMP process) can be performed to remove the cladding material 1101 from above the top surface 282 of the substrate 201. The cladding material 1101 can further be recessed to a desired depth within the trench 255 (see process step 516 and FIG. 12). Recessing of the cladding material 1101 at process step 516 results in formation of a lower cladding layer 251l, which covers the bottom surface of the trench 255. In some embodiments, the cladding material 1101 can be recessed so that the thickness of the lower cladding layer is at least 20 μm. Subsequently, core material 1301 can be deposited over the partially completed structure so as to completely fill the upper portion of trench 255 (see process step 518 and FIG. 13). A polishing process (e.g., a conventional CMP process) can then be performed to remove the core material 1301 from above the top surface 282 of the substrate 201, leaving it within the upper portion of the trench 255 (see process step 520 and FIG. 14). Next, the core material 1301 within the upper portion of the trench 255 can be patterned (e.g., using conventional lithographic patterning and selective etch processes) so that a core layer 252 for the first waveguide 250 remains essentially centered on the lower cladding layer 251l (see process step 522 and FIG. 15). As illustrated, following process step 522, outer edges of the lower cladding layer 251l will extend laterally beyond the side surfaces of the core layer 252 and the side surfaces of the core layer 252 will be physically separated from the sidewalls of the trench 255 by a space. In some embodiments, the core material 1301 can be patterned so that the side surfaces of the resulting core layer 252 are separated from the sidewalls of the trench 255 by at least 20 μm. Additional cladding material 1601 can then be deposited so as to fill the spaces between the side surfaces of the core layer 252 and the sidewalls of the trench 255 (see process step 524 and FIG. 16). Following deposition of the additional cladding material 1601, yet another polishing (e.g., a conventional CMP) process can be performed in order to remove the additional cladding material 1601 from above the top surface 282 of the substrate 201 (see process step 526 and FIG. 17). This CMP process results in the formation of an upper cladding layer 251u-, which is above and immediately adjacent to the outer edges of the lower cladding layer 251l and which extends upward along the sidewalls of the trench 255 such that it is further positioned laterally between and immediately adjacent to the sidewalls of the trench 255 and side surfaces of the core layer 252. Using process flow B results in a multi-layer cladding layer 251.

Process flow B can also be employed to concurrently form an isolation region 260 within an additional trench 265. In this case, both the cladding material 1101 and the additional cladding material 1601 should be suitable isolation materials. In process flow B, the cladding material 1101 can be deposited at process step 514 so that it concurrently fills the trench 255 and the additional trench 265. Optionally, in order to protect the cladding material 1101 within the additional trench 265 during subsequent processing (e.g., during recessing of the cladding material 1101 at process step 516), a protective mask 1201 can be formed thereon (see FIG. 12). After recessing of the cladding material 1101 at process step 516, the protective mask 1201 can be removed. At process step 522, etching of the core material 1301 can be selective so that etching of cladding material 1101 within the additional trench 265 is minimized. Deposition of the additional cladding material 1601 at process step 524 can refill the additional trench 265, if necessary.

The CMP process at process step 526 can result in completion of the isolation region 260 within the additional trench 265.

In process flow A or process flow B, the cladding material for the first waveguide 250 can have a first refractive index and the core material for the first waveguide 250 can have a second refractive index that is greater than the first refractive index to allow for optical signal propagation through the waveguide 250. In some embodiments, the cladding material can be an oxide material, such as silicon dioxide, with a refractive index of less than 2.0 and, more particularly, less than 1.6. In other embodiments, the cladding material could be a different oxide material or some other suitable cladding material with a similarly low refractive index and, particularly, with a first refractive index that is less than the second refractive index of the core material. It should be noted that in process flow B, the cladding material 1101 and the additional cladding material 1601 can be the same or different such that the lower cladding layer 251l and the upper cladding layer 251u are the same or different. In any case, the refractive indices of the cladding material 1101 and the additional cladding material 1601 should be less than that of the core material. In some embodiments, the core material could be a nitride material, such as silicon nitride (SiN), with a refractive index of greater than 2.0. In other embodiments, the core material could be an oxide material, which is different from that used for the cladding material and which similarly has a relatively high refractive index. For example, in some embodiments, the core material could be niobium oxide (NbO) with a refractive index of approximately 2.2 or higher. In other embodiments, the core material could be any other suitable core material with a similarly high refractive index and, particularly, with a second refractive index that is greater than the first refractive index of the cladding material.

Figure 17:
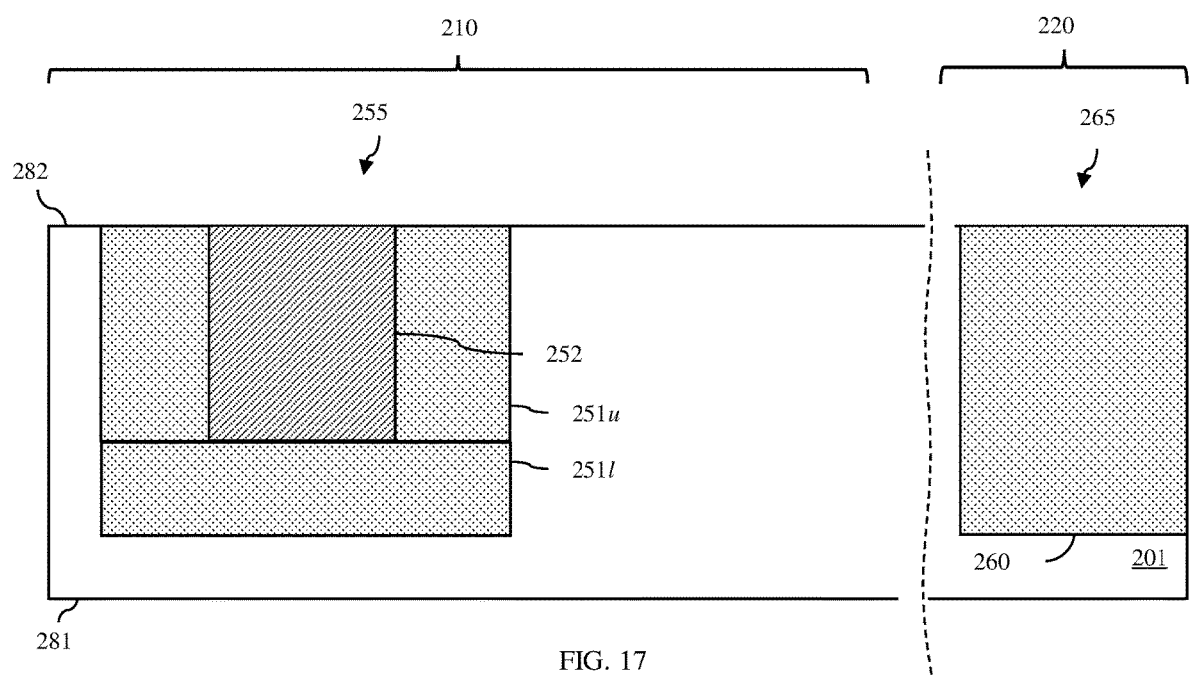

The remaining process steps are illustrated in the drawings with respect to the partially completed structure shown in FIG. 17. However, it should be understood that these same process steps could be performed with respect to the partially completed structure shown in FIG. 10 as well.

Figure 18:
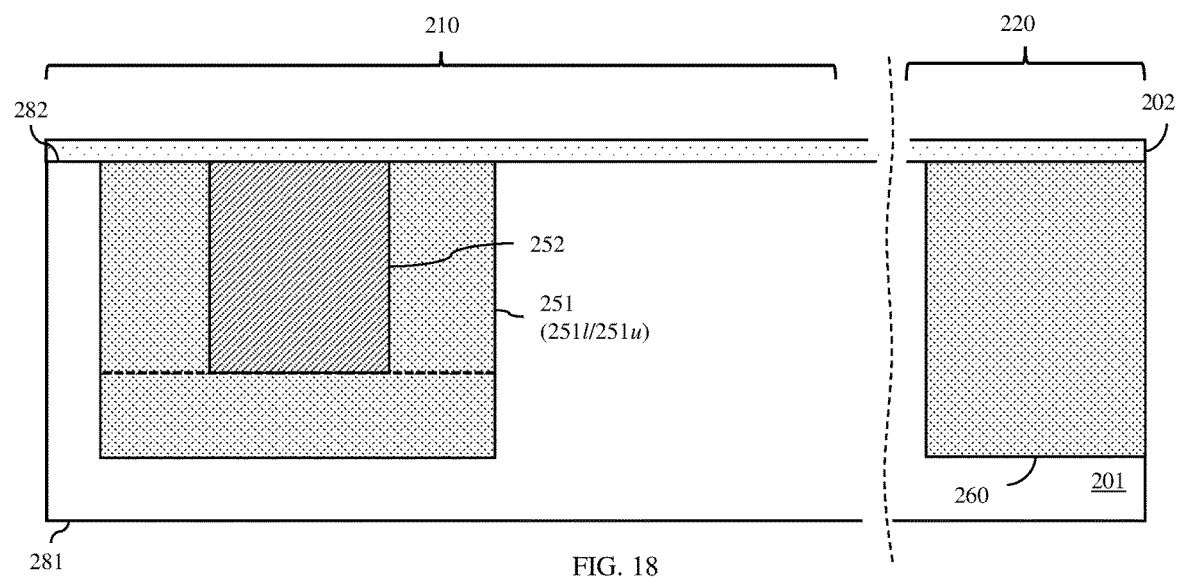

Specifically, the method can further include forming an insulator layer 202 on the top surface 282 of the substrate 201 such that it covers any embedded structures therein including the first waveguide 250 and the isolation region 260 (see process step 528 and FIG. 18). This insulator layer 202 can be, for example, a silicon dioxide layer (also referred to herein as a buried oxide (BOX) layer). The deposited thickness of the insulator layer 202 can be vary depending upon the application and the technology node. For example, the insulator layer 202 can be deposited so as to have a thickness that ranges from less than 100 nm to 0.5 μm or higher (e.g., approximately 2 μm). It should be noted that by locally forming substrate-embedded isolation regions the need for depositing a thick insulator layer 202 (i.e., a thick BOX layer) in some technologies can be eliminated.

Figure 19:
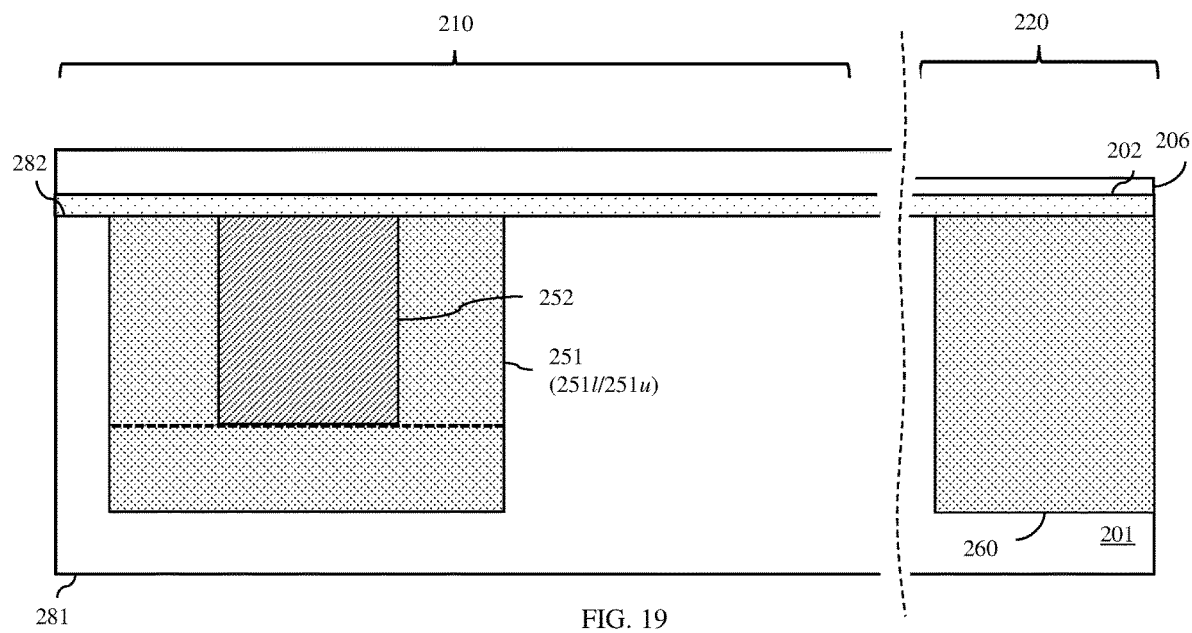

The method can further include forming a silicon layer 206 (and, particularly, a monocrystalline silicon layer) on the insulator layer 202 so as to form the SOI structure (see process step 530 and FIG. 19). Formation of the silicon layer 206 can be achieved using a conventional wafer bonding process. For example, an additional silicon substrate can be bonded to the top surface of the insulator layer 202 (e.g., using a smart cut or other suitable wafer bonding process). A polishing process (e.g., a conventional CMP process) or other suitable process can then be employed to reduce the silicon layer 206 to the desired thickness. As mentioned above with regard to the SOI chip structures, in some embodiments, the Si layer 106 can be thinner within the electronic device area 220 than it is within the optical device area 210. For example, in some embodiments, the thickness of the silicon layer 206 within the electronic device area 220 can be between 50 nm and 100 nm (e.g., approximately 88 nm) and the thickness of the Si layer 206 within the optical device area 210 can be between 125 nm and 175 nm (e.g., approximately 150 nm or 160 nm). Various techniques are well known in the art for varying the thickness of a layer within one area as compared to another and, thus, the details of these techniques have been omitted form this specification in order to allow the reader to focus on the salient aspects of the disclosed methods.

Figure 20:
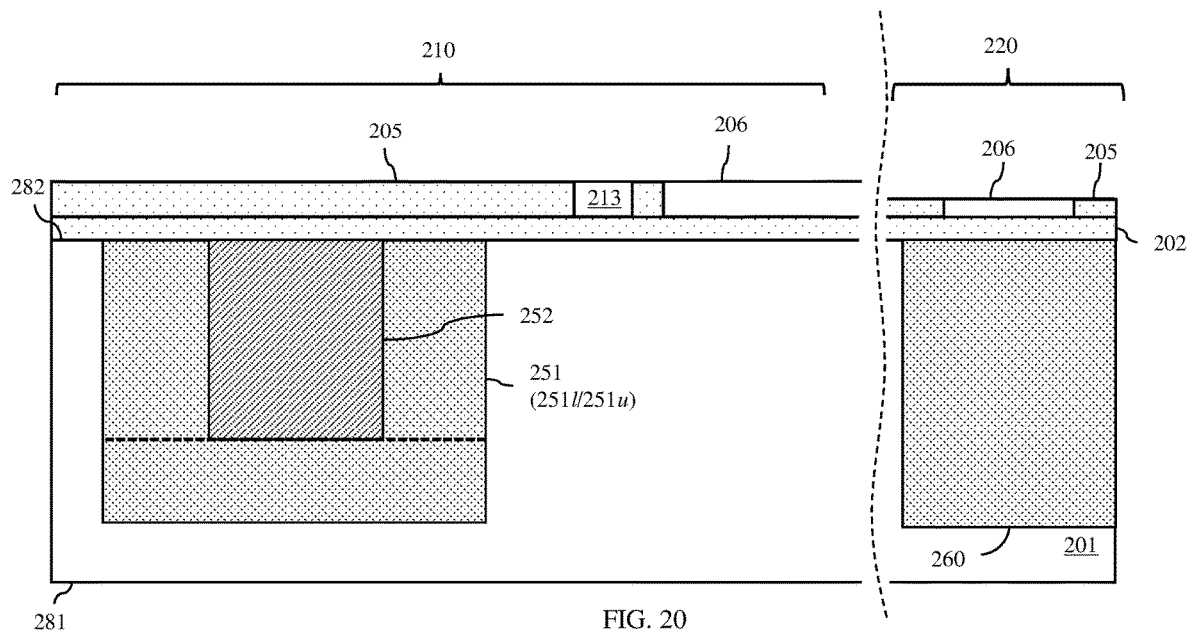

The method can further include forming isolation regions and, particularly, shallow trench isolation (STI) regions 205 within the Si layer 206 (see FIG. 20). For example, shallow trenches can be formed (e.g., using conventional lithographic patterning and etch techniques) such that they extend fully through the Si layer 206 to the insulator layer 202. Each of these shallow trenches can be filled with one or more layers of isolation material. The isolation material of the STI regions 205 can be silicon dioxide or any other suitable isolation material. It should be noted that, if the Si layer 206 is thicker within the optical device area 210 as compared to in the electronic device area 220, the STI regions 205 within the optical device area 210 will also be thicker. Optionally, the thickness of the STI and Si in the electronic device area can be reduced following STI formation. In any case, the STI regions 205 can be patterned in the silicon layer within and between the various device areas so that they define the boundaries of the device areas and so that they isolate devices, as necessary. One STI region 205 can specifically be within the Si layer 206 in the optical device area 210 and aligned above the first waveguide 250. This STI region 205 and the insulator layer 202 can provide additional cladding for the first waveguide 250.

Figure 21:
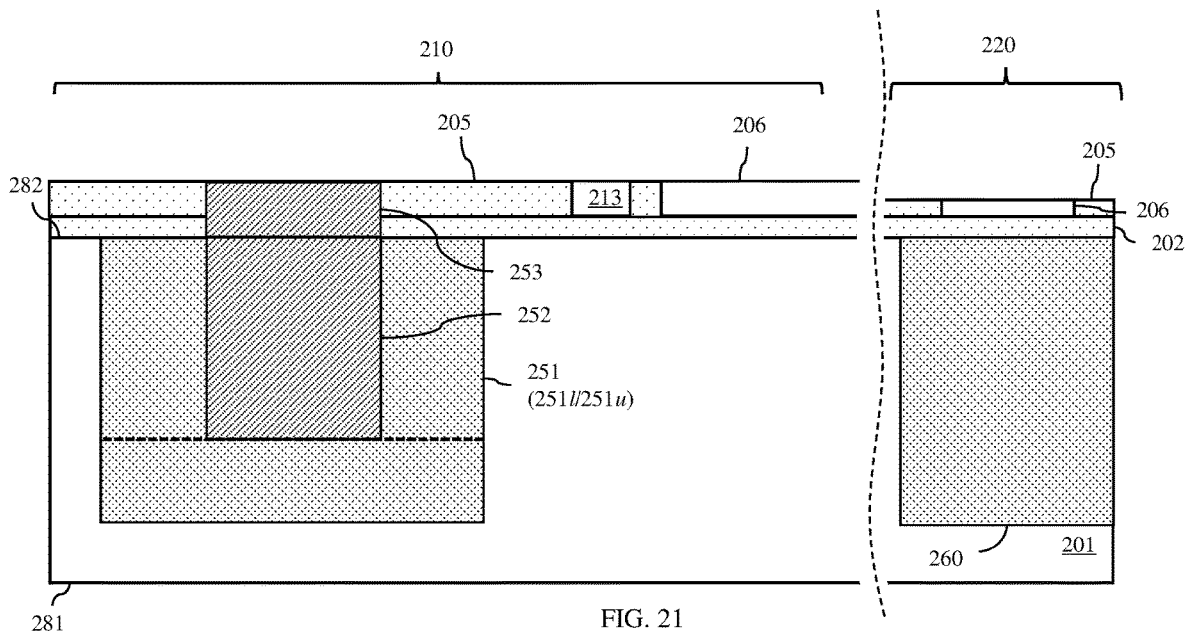

Optionally, the method can further include forming a waveguide extender 253 to enhance coupling between the first waveguide 250 and a second waveguide that will subsequently be formed at process step 540 discussed below (see FIG. 21). Specifically, an opening can be formed (e.g., lithographically patterned and etched) such that it extends vertically through the STI region 205 and the insulator layer 202 and exposes the top of the core layer 252 of the first waveguide 250. The opening can be filled, for example, with the same core material as was used for the core layer 252 of the first waveguide 250 or with the same core material that will be used for the core layer of the second waveguide, thereby forming the waveguide extender 253. Alternatively, the opening could extend only to some depth above the level of the core layer 252, but sufficiently close thereto to enable evanescent-wave coupling with the waveguide extender 253 formed therein.

The method can further include performing front-end-of-the-line (FEOL) processing to form any of one or more additional optical devices in the optical device area 210 and/or one or more electronic devices in the electronic device area 220 (see process step 540 and FIGS. 2A-2C, FIGS. 3A-3B, and FIG. 4). Exemplary FEOL electronic devices that can be formed at process step 540 can include active semiconductor devices and/or passive semiconductor devices. Active semiconductor devices can include, for example, complementary metal oxide semiconductor (CMOS) devices (e.g., one or more field effect transistors (FETs) 222, as illustrated) or any other suitable type of active semiconductor device. Passive semiconductor devices could include, resistors, capacitors, etc. Exemplary FEOL optical devices that could be incorporated into the SOI chip structure 200.1-200.3 include any of the following: one or more second waveguides 214a-214b (e.g., SiN waveguides), one or more third waveguides 213 (e.g., Si waveguides), one or more photodetectors 212 (e.g., germanium photodetectors), and/or any other suitable FEOL optical device. Techniques for forming such FEOL electronic and optical devices are well known in the art and, thus, the details thereof have been omitted from this specification in order to allow the reader to focus on the salient aspects of the disclosed embodiments.

Following completion of FEOL processing, one or more layers of interlayer dielectric (ILD) material 204 can be formed over the partially completed structure and a polishing process (e.g., a conventional CMP process) can be performed. The ILD material 204 can be, for example, doped silicon glass (e.g., phosphosilicate glass (PSG) or borophosphosilicate glass (BPSG)), silicon dioxide, or any other suitable ILD material. In any case, this ILD material 204 should have a relatively low refractive index (e.g., a refractive index of lower than 2.0) to allow it to be employed as cladding material for the second waveguides 214a-214b. The method can further include forming middle-of-the-line (MOL) contacts 289. These MOL contacts 289 can extend vertically through the ILD material 204 to optical and electronic devices, as needed. For example, MOL contacts 289 can land on terminals of the photodetector 212, FET 222, etc.

It should be noted that in the method, the maximum height of the core layer of the third waveguide 213 (e.g., the Si optical waveguide) will be limited by a critical dimension (CD) associated with the Si layer 206. Specifically, the maximum height of the core layer of the third waveguide 213 will be limited by the maximum allowable height of the Si layer 206 within the optical device area 210. Furthermore, the maximum height of the core layer of each second waveguide 214a-214b will be limited, at least in part, by a critical dimension (CD) associated with the MOL contacts 289. Specifically, one CD of the MOL contacts 289 is the maximum allowable height, which is set to minimize contact 289 resistance. Since the MOL contacts 289 have a maximum height, since the MOL contacts and the ILD material 204 through which those MOL contacts extend have coplanar top surfaces, and since the core layer of each second waveguide 214a-214b is embedded within the ILD material 204, then the maximum height of the core layer of each second waveguide 214a-214b can be no more than the height of the ILD material 204 above the top of the Si layer 206 within the optical device area 210. For example, in some embodiments, the maximum height of the core layer of each second waveguide 214a-214b (e.g., each SiN waveguide) above an STI region 205 can be 300 nm. Since the dimensions of the core layers of waveguides determine the properties of those waveguides, including the cut-off wavelength (i.e., the maximum wavelength of any optical signals that can be propagated by the waveguide), the above-described limitations placed on the dimensions of the core layers of the second waveguides 214a-214b and third waveguides 213 also limit their functionality. However, because the first waveguide 250 is embedded within the substrate 201, it is not limited by CDs associated with front-end-of-the-line (FEOL) or middle-of-the-line (MOL) features. Thus, the core layer 252 of the first waveguide 250 can be formed so that its dimensions (which can potentially be measured in the tens or hundreds of microns (μm) depending upon the final thickness of the substrate 201) are significantly larger than the dimensions of the core layers of any second waveguides 214a-214b and/or third waveguides 213 (which are typically measured in the hundreds of nanometers (nm)). Thus, the method can result in a SOI chip structure with multiple waveguides (e.g., a first waveguide 250, second waveguides 214a-214b, and a third waveguide 213) and the first waveguide 250 can have a significantly higher cut-off wavelength than that of any second waveguides 214a-214b or third waveguides 213 and, thus, will bring a different functionality to the SOI chip structure as compared to the second and third waveguides.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
a substrate;
a first waveguide in a trench in the substrate, wherein the first waveguide comprises:

a cladding layer lining the trench, wherein the cladding layer has a horizontal portion above and immediately adjacent to a bottom of the trench and vertical portions positioned laterally immediately adjacent to sidewalls of the trench and further extending vertically from the horizontal portion to a top of the trench; and a core layer on the cladding layer, wherein the core layer is above and immediately adjacent to the horizontal portion, extends laterally between and is immediately adjacent to the vertical portions and further extends vertically from the horizontal portion to the top of the trench;

an insulator layer above and immediately adjacent to the substrate and further extending laterally over at least the vertical portions of the cladding layer at the top of the trench; and a silicon layer above and immediately adjacent to the insulator layer.

2. The structure of claim 1,
wherein the substrate comprises silicon,
wherein the cladding layer of the first waveguide comprises an oxide cladding layer, and
wherein the core layer of the first waveguide comprises any of a silicon nitride core layer and an oxide core layer that is different from the oxide cladding layer.

3. The structure of claim 1, wherein the cladding layer comprises a multi-layer cladding layer with a lower cladding layer comprising the horizontal portion on the bottom of the trench and an upper cladding layer comprising the vertical portions above the lower cladding layer and positioned laterally adjacent to the sidewalls of the trench.

4. The structure of claim 1, further comprising:
an isolation region in the silicon layer above the first waveguide; and
at least one second waveguide above the isolation region.

5. The structure of claim 4, wherein a core layer of the second waveguide overlays the core layer of the first waveguide.

6. The structure of claim 5, further comprising: a waveguide extender that extends through the isolation region and the insulator layer, wherein the core layer of the first waveguide and the core layer of the second waveguide are in contact with the waveguide extender.

7. The structure of claim 4, wherein a core layer of the second waveguide is completely offset from the core layer of the first waveguide.

8. The structure of claim 4, wherein a core layer of the second waveguide has smaller dimensions than the core layer of the first waveguide.

9. The structure of claim 4, further comprising: a third waveguide, wherein a core layer of the third waveguide comprises a portion of the silicon layer.

10. The structure of claim 1, further comprising: an additional optical device comprising a portion of the silicon layer.

11. The structure of claim 1, further comprising: an electronic device comprising a portion of the silicon layer.

12. The structure of claim 1,
wherein the substrate has an additional trench,
wherein the structure further comprises an isolation region in the additional trench, and
wherein the insulator layer further extends laterally over the isolation region.

13. A method comprising:
providing a substrate;
forming a trench in the substrate;
forming a first waveguide in the trench, wherein the first waveguide comprises:
a cladding layer lining the trench, wherein the cladding layer has a horizontal portion above and immediately adjacent to a bottom of the trench and vertical portions positioned laterally immediately adjacent to sidewalls of the trench and further extending vertically from the horizontal portion to a top of the trench; and
a core layer on the cladding layer, wherein the core layer is above and immediately adjacent to the horizontal portion, extends laterally between and is immediately adjacent to the vertical portions and further extends vertically from the horizontal portion to the top of the trench; and forming an insulator layer above and immediately adjacent to the substrate and further extending laterally over at least the vertical portions of the cladding layer at the top of the trench; and forming a silicon layer above and immediately adjacent to the insulator layer.

14. The method of claim 13, wherein the forming of the first waveguide comprises:
depositing cladding material to line the trench; and
depositing core material on the cladding layer so as to fill the trench.

15. The method of claim 13, wherein the forming of the first waveguide comprises:
depositing cladding material to fill the trench;
recessing the cladding material so as to leave, at a bottom of the trench, a lower cladding layer for the first waveguide;
depositing core material on the lower cladding layer to fill the trench;
patterning the core material within the trench to form the core layer for the first waveguide and to separate the core layer from sidewalls of the trench; and
depositing additional cladding material to fill spaces between the core layer and the sidewalls of the trench and form an upper cladding layer above the lower cladding layer.

16. The method of claim 13, further comprising:
during the forming of the trench, concurrently forming an additional trench in the substrate; and
filling the additional trench with isolation material to form an isolation region, wherein the isolation material for the isolation region and cladding material for the first waveguide are a same material and wherein the insulator layer is deposited onto the substrate so as to cover both the first waveguide and the isolation region.

17. The method of claim 13, further comprising:
forming an isolation region in the silicon layer; and
forming a second waveguide above the isolation region, wherein a core layer of the second waveguide has smaller dimensions than the core layer of the first waveguide.

18. The method of claim 17, further comprising: forming a waveguide extender that extends through the isolation region and the insulator layer, wherein the second waveguide is formed after the waveguide extender and such that the core layer of the second waveguide is in contact with the waveguide extender.

19. The method of claim 17, further comprising using the silicon layer to form at least one of a third waveguide, an additional optical device, and an electronic device.

20. A structure comprising:
a substrate;

a first waveguide in a trench in the substrate, wherein the first waveguide comprises a cladding layer lining the trench and a core layer on the cladding layer;

an insulator layer on the substrate and extending laterally over the first waveguide;

a silicon layer on the insulator layer;

an isolation region in the silicon layer above the first waveguide; and at least one second waveguide above the isolation region.

\* \* \* \* \*